US010249349B2

(12) United States Patent
Takizawa et al.

(10) Patent No.: US 10,249,349 B2
(45) Date of Patent: Apr. 2, 2019

(54) CONTROL SYSTEM

(71) Applicant: Toshiba Memory Corporation, Minato-ku, Tokyo (JP)

(72) Inventors: Kazutaka Takizawa, Yokohama Kanagawa (JP); Yoshihisa Kojima, Kawasaki Kanagawa (JP); Sumio Kuroda, Yokohama Kanagawa (JP); Masaaki Niijima, Machida Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/691,799

(22) Filed: Aug. 31, 2017

(65) Prior Publication Data
US 2018/0277173 A1 Sep. 27, 2018

(30) Foreign Application Priority Data

Mar. 24, 2017 (JP) ................. 2017-059624

(51) Int. Cl.
*G11C 7/04* (2006.01)
*G11C 7/22* (2006.01)

(52) U.S. Cl.
CPC . *G11C 7/04* (2013.01); *G11C 7/22* (2013.01)

(58) Field of Classification Search
CPC .................................. G11C 7/04; G11C 7/22
USPC ....................... 365/189.011–225.7
See application file for complete search history.

(56) References Cited

U.S. PATENT DOCUMENTS

| 7,436,724 | B2 * | 10/2008 | Nandi | G11C 5/147 257/E27.103 |
|---|---|---|---|---|
| 8,238,185 | B2 | 8/2012 | Lee et al. | |
| 8,472,274 | B2 | 6/2013 | Fai et al. | |
| 8,644,074 | B2 * | 2/2014 | Chang | G11C 16/3418 365/185.17 |
| 2008/0031066 | A1 * | 2/2008 | Nandi | G11C 5/147 365/211 |
| 2011/0205823 | A1 | 8/2011 | Hemink et al. | |
| 2012/0134213 | A1 | 5/2012 | Choi et al. | |
| 2012/0213005 | A1 | 8/2012 | Lee | |
| 2015/0131389 | A1 * | 5/2015 | Furutani | G11C 8/06 365/189.05 |
| 2015/0364188 | A1 | 12/2015 | Lee et al. | |

FOREIGN PATENT DOCUMENTS

| JP | 2002-367382 A | 12/2002 |
|---|---|---|
| JP | 2012-113810 A | 6/2012 |
| JP | 2012-174331 A | 9/2012 |
| JP | 2014-509769 A | 4/2014 |
| JP | 5693615 B2 | 4/2015 |

* cited by examiner

*Primary Examiner* — Harry W Byrne
(74) *Attorney, Agent, or Firm* — White & Case LLP

(57) ABSTRACT

According to one embodiment, a control system includes: a memory device; and a controller. The memory device includes a first cell transistor. The controller is configured to store information on a first temperature associated with a temperature of the memory device upon a write of data in the first cell transistor, obtain a second temperature of the memory device, determine an adjustment from adjustments based on a combination of the first temperature and the second temperature, and instruct the memory device to use for a first parameter a first value and a value which is based on the determined adjustment to read data from the first cell transistor.

20 Claims, 33 Drawing Sheets

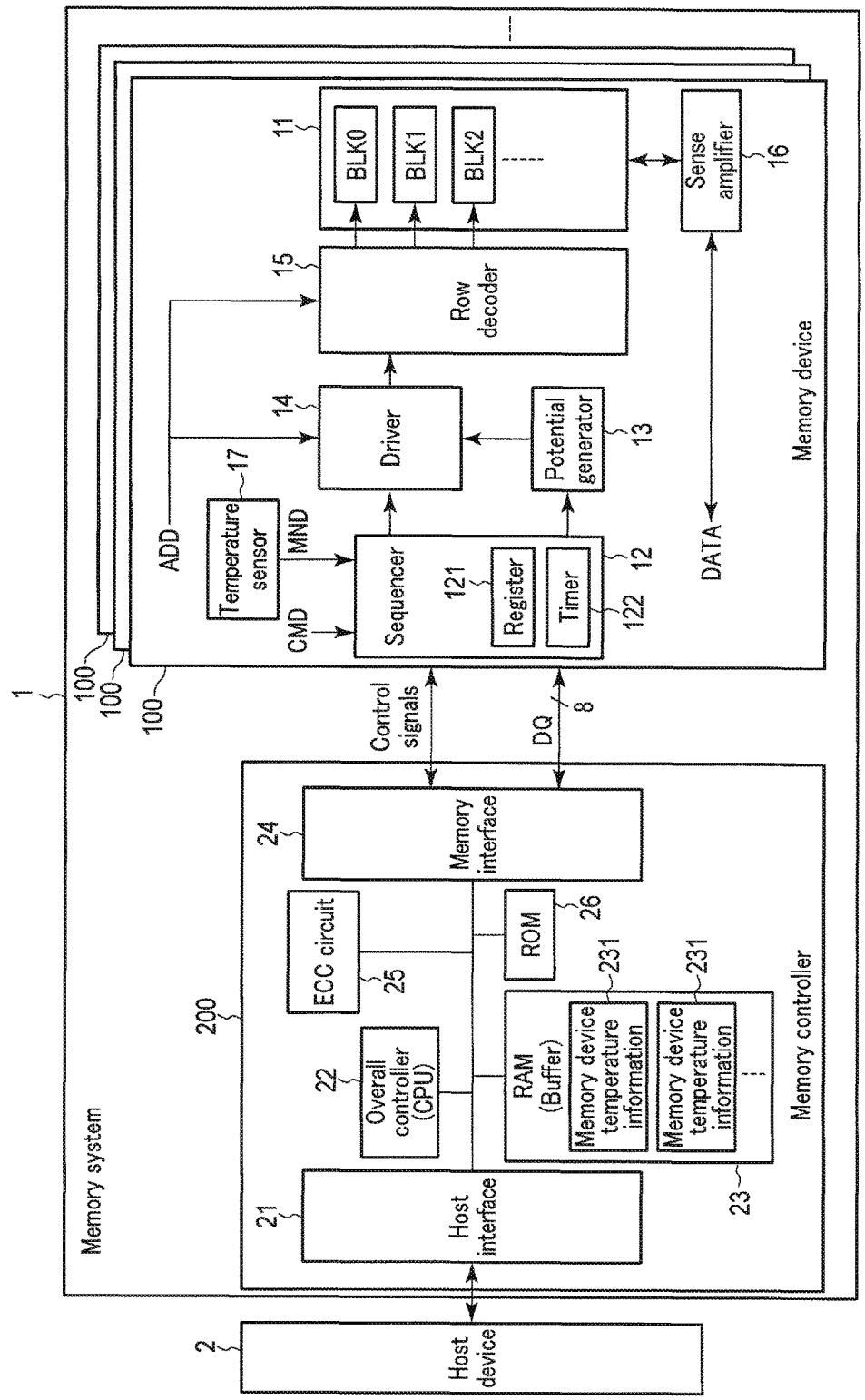
F I G. 1

Temperature combination table (for parameter 1)
| Write temperature [°C] \ Read temperature [°C] | TR0 | TR1 | ... | TR6 | TR7 | TR8 |
|---|---|---|---|---|---|---|
| TW0 | ΔA0 | ΔA1 | ... | ΔA6 | ΔA7 | ΔA8 |
| TW1 | ΔA10 | ΔA11 | ... | ΔA16 | ΔA17 | ΔA18 |
| ... | ... | ... | ... | ... | ... | ... |
| TW6 | ΔA60 | ΔA61 | ... | ΔA66 | ΔA67 | ΔA68 |
| TW7 | ΔA70 | ΔA71 | ... | ΔA76 | ΔA77 | ΔA78 |
| TW8 | ΔA80 | ΔA81 | ... | ΔA86 | ΔA87 | ΔA88 |
Temperature combination table (for parameter 2)
Temperature combination table (for parameter 3)
Temperature combination table (for parameter 4)
F I G. 10
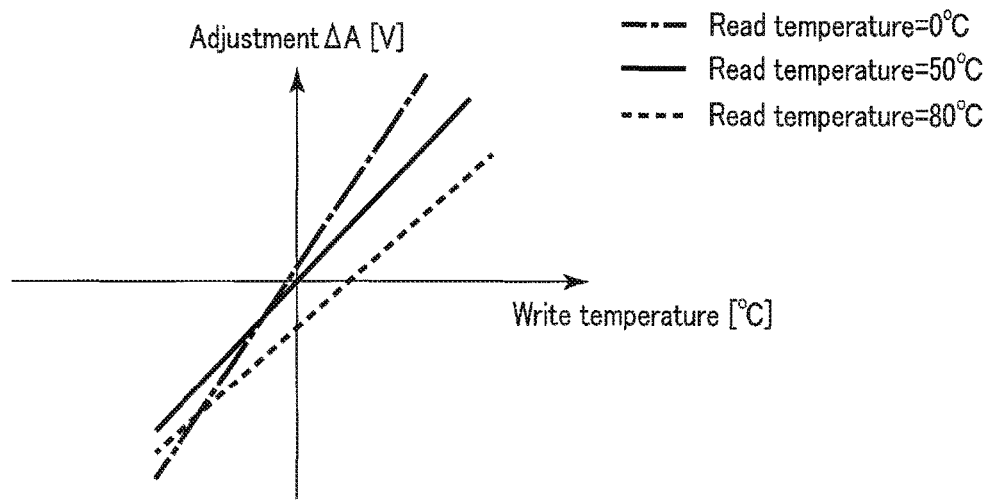
F I G. 11

Temperature combination table (for parameter 1)

Temperature combination table (for erasure temperature = TE0)

|  | Read temperature [°C] | | | | | |
|---|---|---|---|---|---|---|
|  | TR0 | TR1 | ... | TR6 | TR7 | TR8 |
| TW0 | ΔB0 | ΔB1 | ... | ΔB6 | ΔB7 | ΔB8 |
| TW1 | ΔB10 | ΔB11 | ... | ΔB16 | ΔB17 | ΔB18 |
| ... | ... | ... | ... | ... | ... | ... |
| TW6 | ΔB60 | ΔB61 | ... | ΔB66 | ΔB67 | ΔB68 |
| TW7 | ΔB70 | ΔB71 | ... | ΔB76 | ΔB77 | ΔB78 |
| TW8 | ΔB80 | ΔB81 | ... | ΔB86 | ΔB87 | ΔB88 |

(Write temperature [°C])

Temperature combination table (for erasure temperature = TE1)
Temperature combination table (for erasure temperature = TE2)
Temperature combination table (for erasure temperature = TE8)

FIG. 18

Erasure and write temperature table

| | | Erasure temperature [°C] | Write temperature [°C] |
|---|---|---|---|
| Block address | 0 | TE3 | TW2 |
| | 1 | TE3 | TW2 |
| | 2 | TE3 | TW2 |
| | 3 | TE2 | TW2 |
| | 4 | TE3 | TW4 |
| | 5 | TE4 | TW4 |
| | ⋮ | | |

FIG. 19

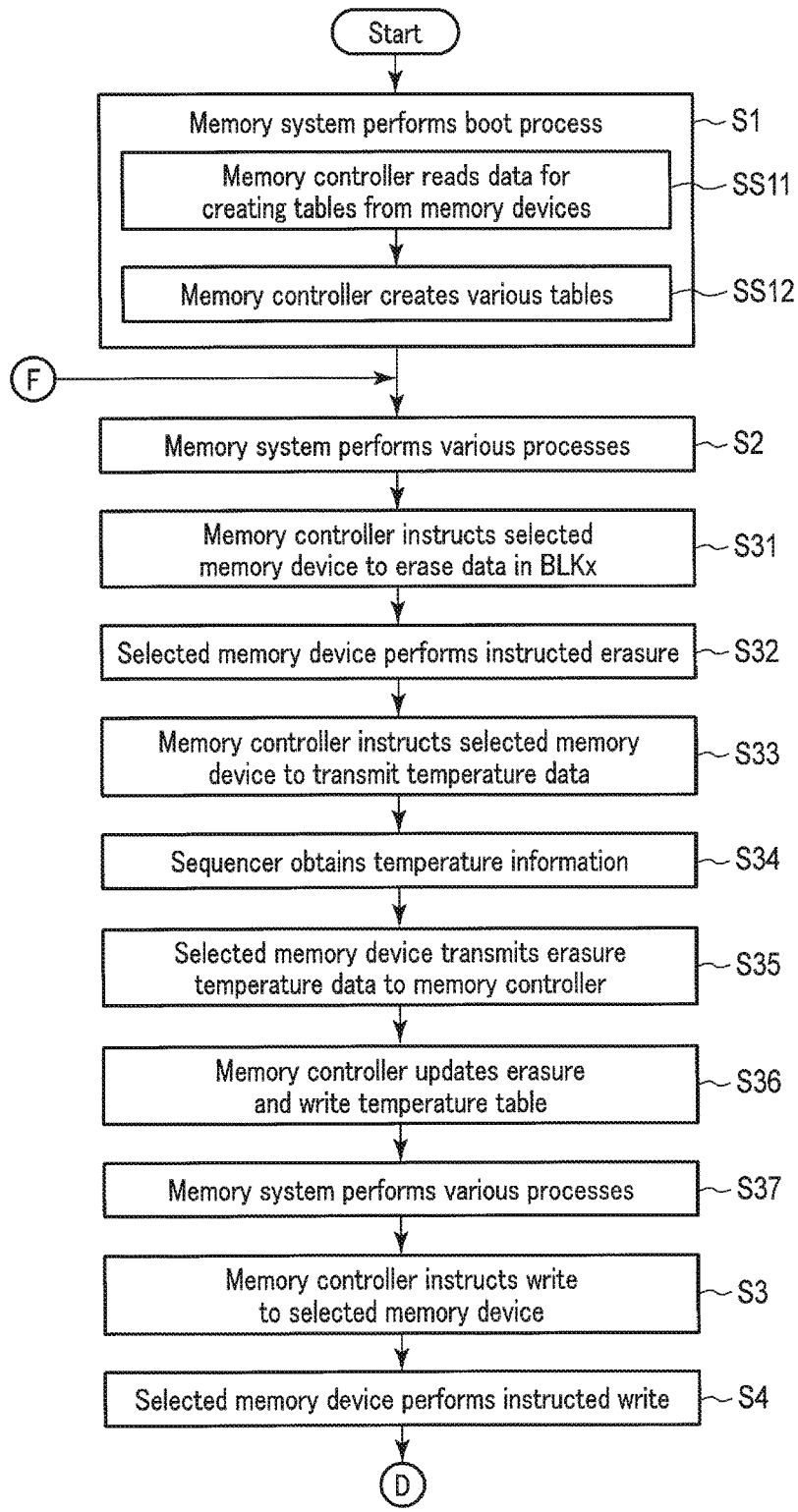
F I G. 20

Write temperature and parameter adjustment table

| | | Parameter 1 | Parameter 2 | ... |
|---|---|---|---|---|
| Write temperature [°C] | TW0 | $\Delta C10$ | $\Delta C20$ | ... |
| | TW1 | $\Delta C11$ | $\Delta C21$ | ... |
| | ... | ... | ... | ... |
| | TW6 | $\Delta C16$ | $\Delta C26$ | ... |
| | TW7 | $\Delta C17$ | $\Delta C27$ | ... |
| | TW8 | $\Delta C18$ | $\Delta C28$ | ... |

F I G. 23

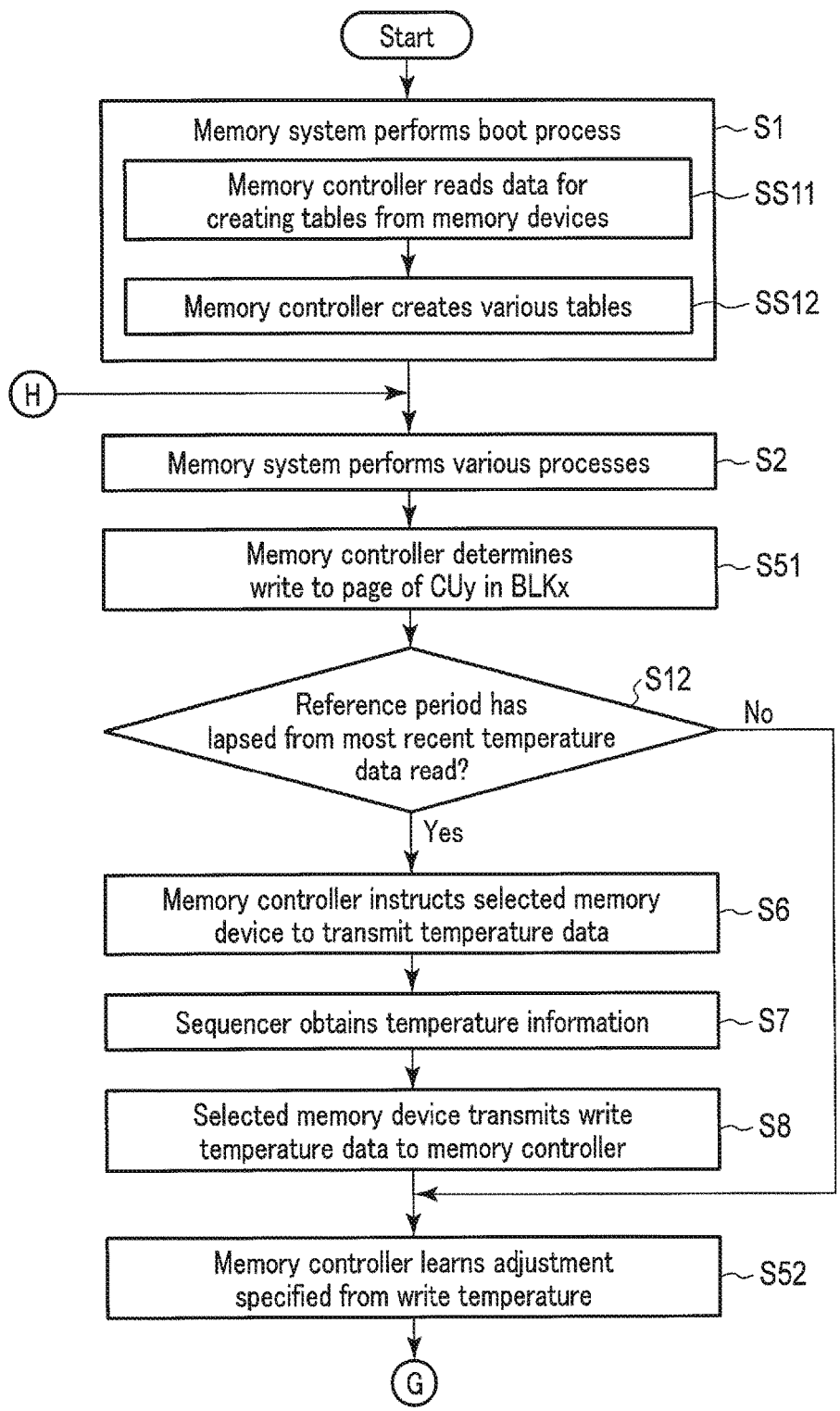
F I G. 24

Erasure temperature and parameter adjustment table

| | | Parameter 1 | Parameter 2 | ... |
|---|---|---|---|---|
| Erasure temperature [°C] | TE0 | ΔD10 | ΔD20 | ... |
| | TE1 | ΔD11 | ΔD21 | ... |
| | ... | ... | ... | ... |
| | TE6 | ΔD16 | ΔD26 | ... |
| | TE7 | ΔD17 | ΔD27 | ... |
| | TE8 | ΔD18 | ΔD28 | ... |

F I G. 26

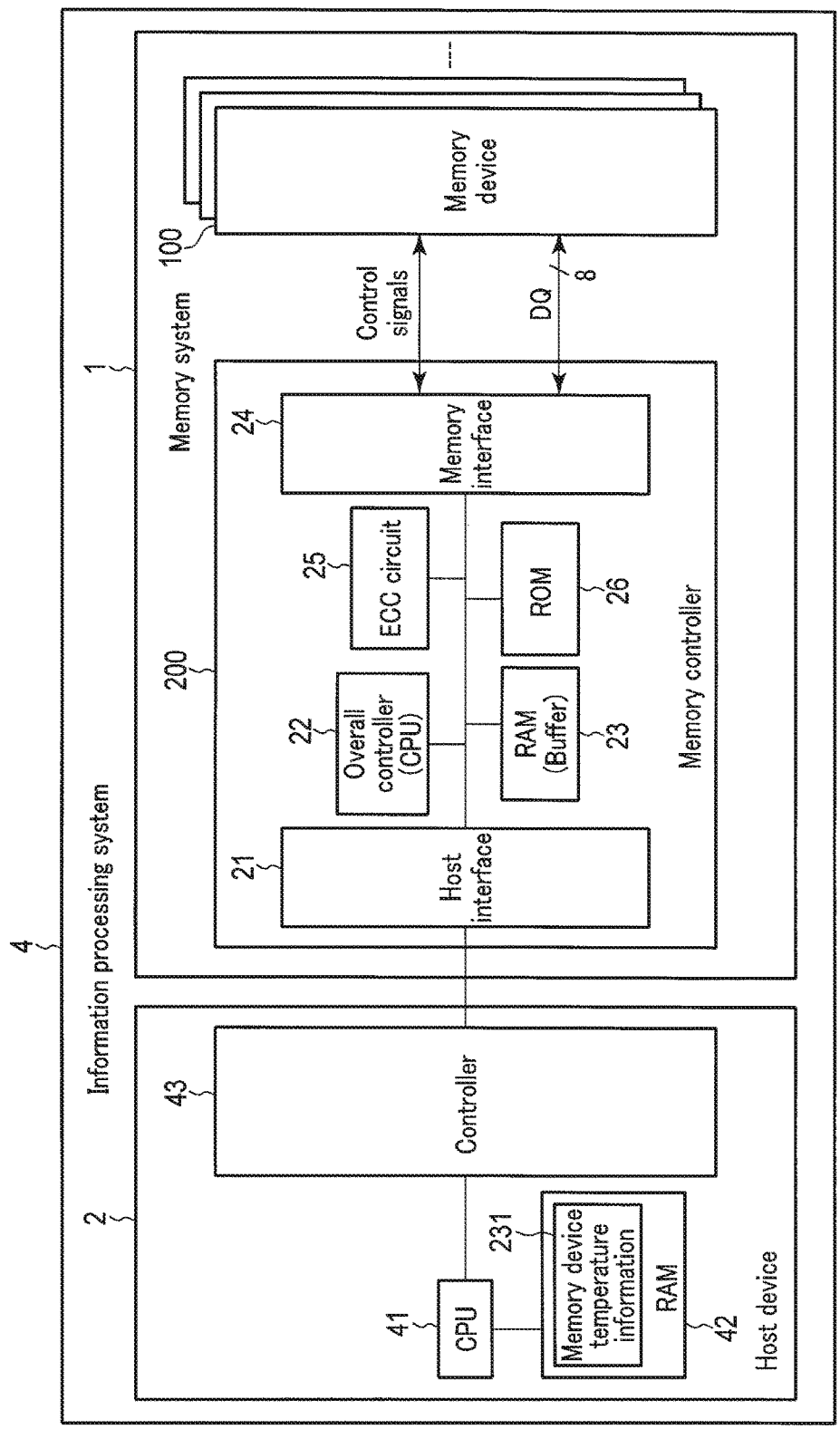
F I G. 29

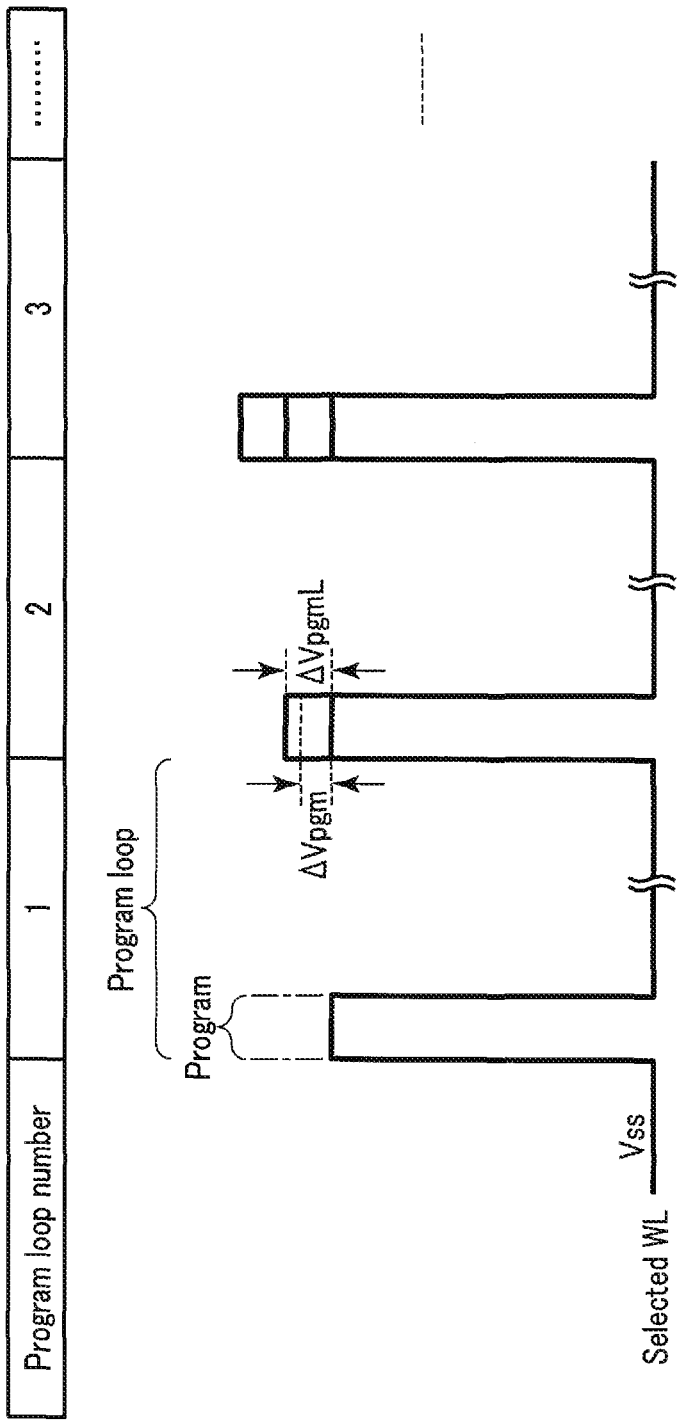
F I G. 33

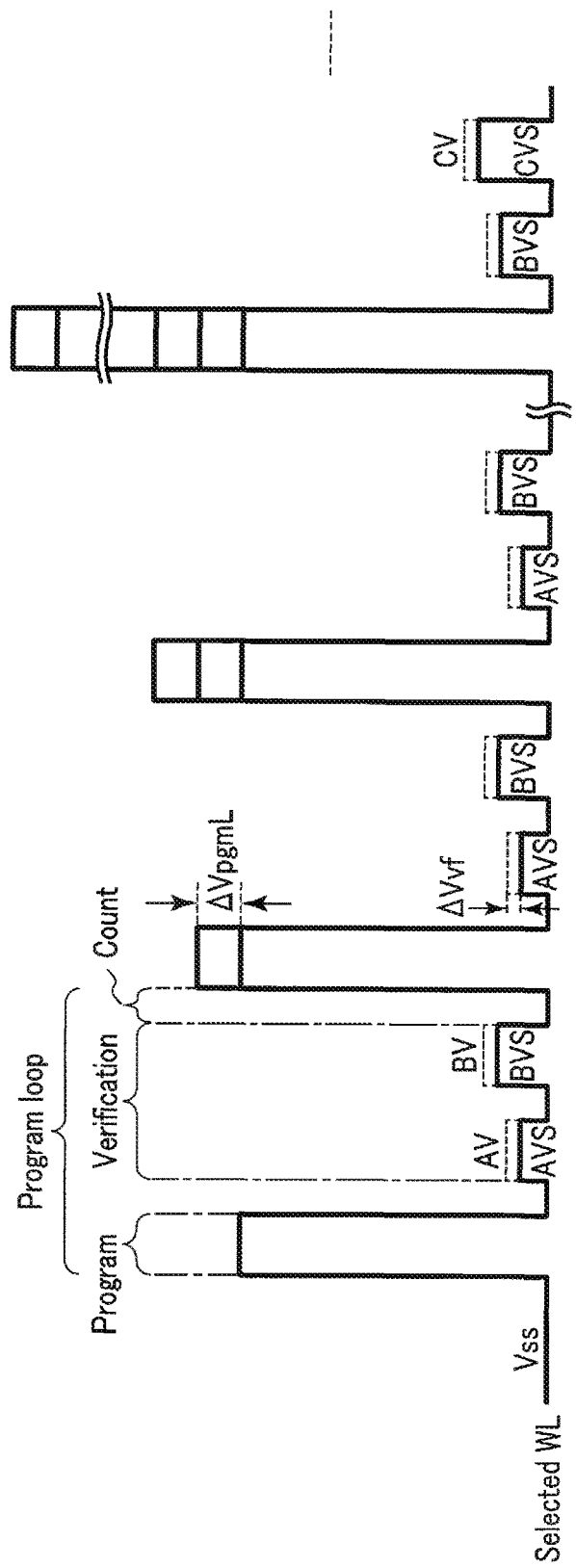
F I G. 35

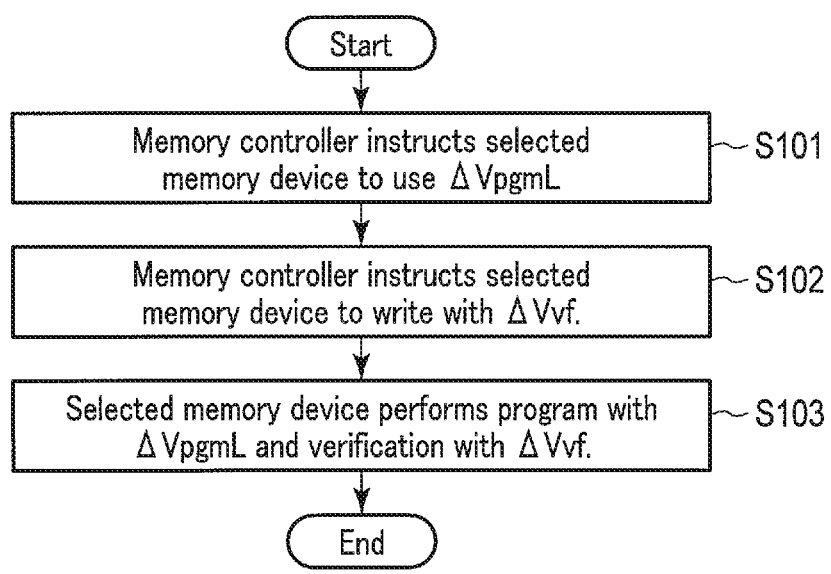
F I G. 37

CONTROL SYSTEM

CROSS-REFERENCE TO RELATED APPLICATIONS

This application is based upon and claims the benefit of priority from Japanese Patent Application No. 2017-59624, filed Mar. 24, 2017, the entire contents of which are incorporated herein by reference.

FIELD

Embodiments described herein relate generally to a control system to control a memory device.

BACKGROUND

A memory system including a nonvolatile memory device and a memory controller to control such a memory device is known. For improved performance of the memory system, the memory controller needs to control the memory device better.

BRIEF DESCRIPTION OF THE DRAWINGS

FIG. 1 illustrates functional blocks of a memory system of a first embodiment;

FIG. 10 illustrates temperature combination tables according to the first embodiment;

FIG. 11 illustrates relationships among write temperatures, read temperatures, and adjustments according to the first embodiment;

FIG. 18 illustrates temperature combination tables according to a second embodiment;

FIG. 19 illustrates an erasure/write temperature table according to the second embodiment;

FIG. 20 illustrates a part of the flow of operation of the memory system of the second embodiment;

FIG. 23 illustrates a write temperature and parameter adjustment table according to a third embodiment;

FIG. 24 illustrates a part of the flow of operation of the memory system of the third embodiment;

FIG. 26 illustrates an erasure temperature and parameter adjustment table according to a fourth embodiment;

FIG. 29 illustrates functional blocks of an information processing system of a fifth embodiment;

FIG. 33 illustrates some voltages applied to a selected word line in a sixth embodiment;

FIG. 35 illustrates voltages applied to the selected word line in the sixth embodiment;

FIG. 37 illustrates the flow of operation of the memory system of the sixth embodiment.

DETAILED DESCRIPTION

Figure 2:
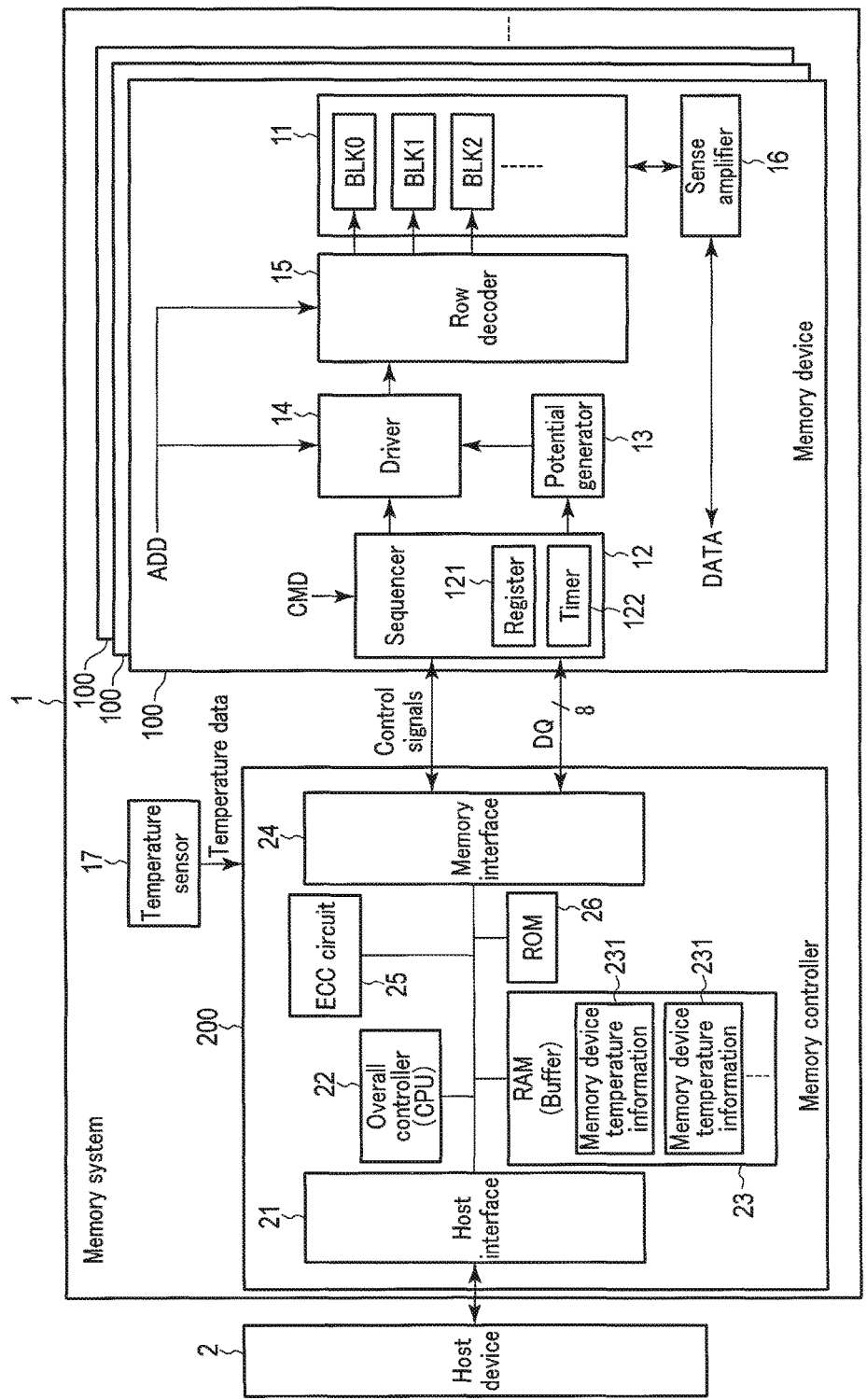
FIG. 2 illustrates another example of functional blocks of the memory system of the first embodiment.

In general, according to one embodiment, a control system includes: a memory device; and a controller. The memory device includes a first cell transistor. The controller is configured to store information on a first temperature associated with a temperature of the memory device upon a write of data in the first cell transistor, obtain a second temperature of the memory device, determine an adjustment from adjustments based on a combination of the first temperature and the second temperature, and instruct the memory device to use for a first parameter a first value and a value which is based on the determined adjustment to read data from the first cell transistor.

Embodiments will now be described with reference to the figures. In the following description, components with substantially the same functionalities and configurations will be referred to with the same reference numerals, and repeated descriptions may be omitted. All descriptions for a particular embodiment also apply to another embodiment unless explicitly mentioned otherwise or obviously eliminated. Each functional block can be implemented as hardware, computer software, or the combination of the both. It is not necessary that functional blocks are distinguished as in the following examples. For example, some of the functions may be implemented by functional blocks different from those illustrated below. Any step in a flow of a method of an embodiment is not limited to any illustrated order, and can occur in an order different from an illustrated order and/or can occur concurrently with another step unless stated otherwise.

A phrase of a particular first component being "coupled" to another second component herein includes the first component being coupled to the second component either directly or via one or more components which are always or selectively conductive.

First Embodiment

<1.1. Configuration (Structure)>
<1.1.1. Memory System>

FIG. 1 illustrates functional blocks of a memory system 1 of the first embodiment. As illustrated in FIG. 1, the memory system 1 serves as a storage for a host device 2, communicates with the host device 2, and stores and reads data from and to the host device 2 based on instructions of the host device 2.

The host device 2 is, for example, a server computer or a personal computer, performs information processing and stores data using the memory system 1. The host device 2 divides the memory space provided by the memory system 1 into plural logical areas, and adds a logical address to each logical area. It uses the logical addresses to manage the memory space of the memory system 1. When the host device 2 determines that write-target data will be stored in a particular logical area, the host device 2 assigns the determined logical address to the write-target data. The host device 2 then instructs a memory device 100 to write the write-target data to the logical area identified by the logical address. The host device 2 specifies read-target data in the memory system 1 with a logical address.

The memory systems 1 is, for example, a memory card such as an SD card, and a solid state device (SSD). The memory system 1 includes plural memory devices 100 and a memory controller 200. The memory devices 100 and the memory controller 200 may be separate chips sealed into respective separate packages (for example, resin), or may be in one chip.

The memory devices 100 have the same components and connections. Hereinafter, one memory device 100 is described as a representative. The descriptions for the representative memory device 100 apply to other memory devices 100. The memory device 100 stores data in a non-volatile manner, and is, for example, a NAND flash memory.

The memory controller 200 receives commands from the host device 2, and controls the memory device 100. The control of the memory device 100 includes one irrelevant to commands received from the host device 2, and one based on commands received from the host device 2. For example, the memory controller 200 writes data which the memory controller 200 is instructed to write by the host device 2 in the memory device 100, reads data which the memory controller 200 is instructed to read by the host device 2 from the memory device 100, and transmits the same to the host device 2.

The memory controller 200 also manages the memory devices 100. The management includes management of address mapping, and management of the states of the memory devices 100. The address mapping is one between logical addresses and physical addresses. A physical address is information to identify a memory area provided by the memory device 100. Specifically, when instructed to perform a write, the memory controller 200 manages the logical address of the write-instructed data and the physical address of the memory area in the memory device 100 in which that data has been written with the address mapping table. When the memory controller 200 is instructed to read data from memory area of a particular logical address, it refers to the address mapping table, obtains the physical address associated with that logical address, and reads data from the memory area of the obtained physical address. The management of the state of the memory device 100 includes management of defective memory areas (or, one or more blocks BLK, to be described below) of the memory device 100, wear leveling, garbage collection, and refresh.

<1.1.2. Memory Controller>

The memory controller 200 includes a host interface 21, an overall controller 22, a random access memory (RAM) 23, a memory interface 24, an error correction code (ECC) circuit 25, and a read only memory (ROM) 26. The memory controller 200 includes a processor, such as a central processing unit (CPU), as hardware, and performs some or all of functions of each of the host interface 21, the overall controller 22, the memory interface 24, and the ECC circuit 25 when firmware (program) stored in the ROM 26 and loaded onto the RAM 23 is executed by the processor. The host interface 21, the overall controller 22, the RAM 23, the memory interface 24, and the ECC circuit 25 are coupled to each other by a bus.

The host interface 210 includes hardware components and/or software to couple the memory controller 200 and the host device 2 communicatively in accordance with a particular communications standard. Specifically, the host interface 21 includes hardware (for example, connectors and/or pins) for physical connection via a bus with the host device 2, and is coupled to the host device 2 via the bus. The host interface 21 performs various processes to enable the memory controller 200 and the host device 2 to communicate in accordance with the communications standard to which the host interface 21 conforms. Examples of the host interface 21 and/or the communications standard to which the host interface 21 conform include Advanced Technology Attachment (ATA), Serial ATA (BATA), Serial Attached Small computer system interface (SAS), and Peripheral Component Interconnect Express (PCIe).

The RAM 23 temporarily stores data and serves as a buffer. The data includes data received from the host device 2, data to be transmitted to the host device 2, data to be written in the memory device 100 (or, write data) and data read from the memory device 100 (or, read data), various management data which indicates the states of the memory devices 100 and is referred to by the overall controller 22 for controlling the memory device 100 (including the address mapping table), and firmware. The RAM 23 further stores plural units of memory device temperature information 231. Each of the units of memory device temperature information 231 includes temperature information on one or more corresponding memory devices 100.

The memory device temperature information 231 will be described in full detail below.

The memory interface 24 is physically coupled to the memory device 100 by a NAND bus, and transmits and receives signals in accordance with a NAND interface. The NAND bus transmits signals in accordance with the NAND interface. The signals according to the NAND interface include various control signals, input/output signals DQ, and a ready busy signal RY/BYn, for example. The signals DQ (DQ0 to DQ7) have a width, for example, of eight bits, and include commands (CMD), write data and read data (DAT), address signals (ADD), and various kinds of management data. The ready busy signal RY/BYn is independent for each memory device 100, and indicates that the memory devices 100 transmitting the corresponding ready busy signal RY/BYn are in a ready or busy state, for example, with a logical high or low, respectively. The memory device 100 accepts commands from the memory controller 200 in the ready state, and does not in the busy state.

The ECC circuit 25 generates error correction data for correcting errors of particular substantial data. The substantial data includes data instructed to be written by the host device 2 and management data. The error correction data can be generated by any known methods, and includes, for example, parity data. The set of substantial data and corresponding error correction data is written in the memory device 100 as write data. A technique for generating error correction data and the size of the same determine the number of correctable errors of corresponding substantial data. In general, the larger the error correction data, the more the correctable errors, i.e., the larger error correction capability. The ECC circuit 25 selects one of plural error correction capabilities, and can generate the error correction data for the selected error correction capability.

The ECC circuit 25 performs operations to data read from the memory device 100, and attempts to obtain correct (error-corrected) data in the read data, such as host read data or management data. The ECC circuit 25 can obtain correct substantial data from the read data when the read data includes errors less than an error correction capability which depends on the error correction data included in the read data.

The overall controller 22 is implemented by some of the functions of the processor and the RAM 23, for example. The overall controller 22 controls the host interface 21, the RAM 23, the memory interface 24, and the ECC circuit 25. The overall controller 22 manages the above address mapping and/or the states of the memory devices 100 while controlling the RAM 23 and the memory interface 24 in reads and writes.

<1.1.3. Memory Device>

The memory device 100 includes components, such as a memory cell array 11, a sequencer (controller) 12, a potential generator 13, a driver 14, a row decoder 15, a sense amplifier 16, and a temperature sensor 17.

The memory cell array 11 includes memory blocks BLK (BLK0, BLK1, . . . ). A block BLK is a physical unit of the memory cell array 11, and data in each block BLK is erased together. Each block ELK includes plural cell transistors. The cell transistors store write data from the memory controller 200 in a non-volatile manner.

The potential generator 13 generates various potentials (or, voltages). The generated potentials are supplied to components, such as the driver 14 and the sense amplifier 16. The driver 14 receives the address signals ADD, selects some of the potentials from the potential generator 13 based on the address signals ADD, and supplies the selected potentials to the row decoder 15.

The row decoder 15 receives the address signals ADD, selects one block BLK based on the address signals ADD, and transfers the potentials from the driver 14 to the selected block BLK.

The sense amplifier 16 senses states of the cell transistors MT, generates read data based on the sensed states, and transfers write data to the cell transistors MT.

The temperature sensor 17 measures the temperature of the memory device 100 at a particular interval, and supplies temperature information MND indicating the measured temperature to the sequencer 12 in response to an instruction of the sequencer 12.

The sequencer 12 controls components, such as the potential generator 13, the driver 14, and sense amplifier 16, based on the commands CMD. The sequencer 12 includes a register 121 and a timer 122. The register 121 includes plural memory areas, each of which can be specified by the unique address and can store information of one or more bits. The register 121 stores various data in each memory area. The data stored includes the temperature information MND.

The temperature sensor 17 can be provided in a place in the memory system 1 other than in the memory device 100 as illustrated in FIG. 2. In this case, the memory controller 200 transmits an instruction to the temperature sensor 17 to obtain below-mentioned temperature data from the temperature sensor 17.

<1.1.3.1. Cell Array>

Figure 3:
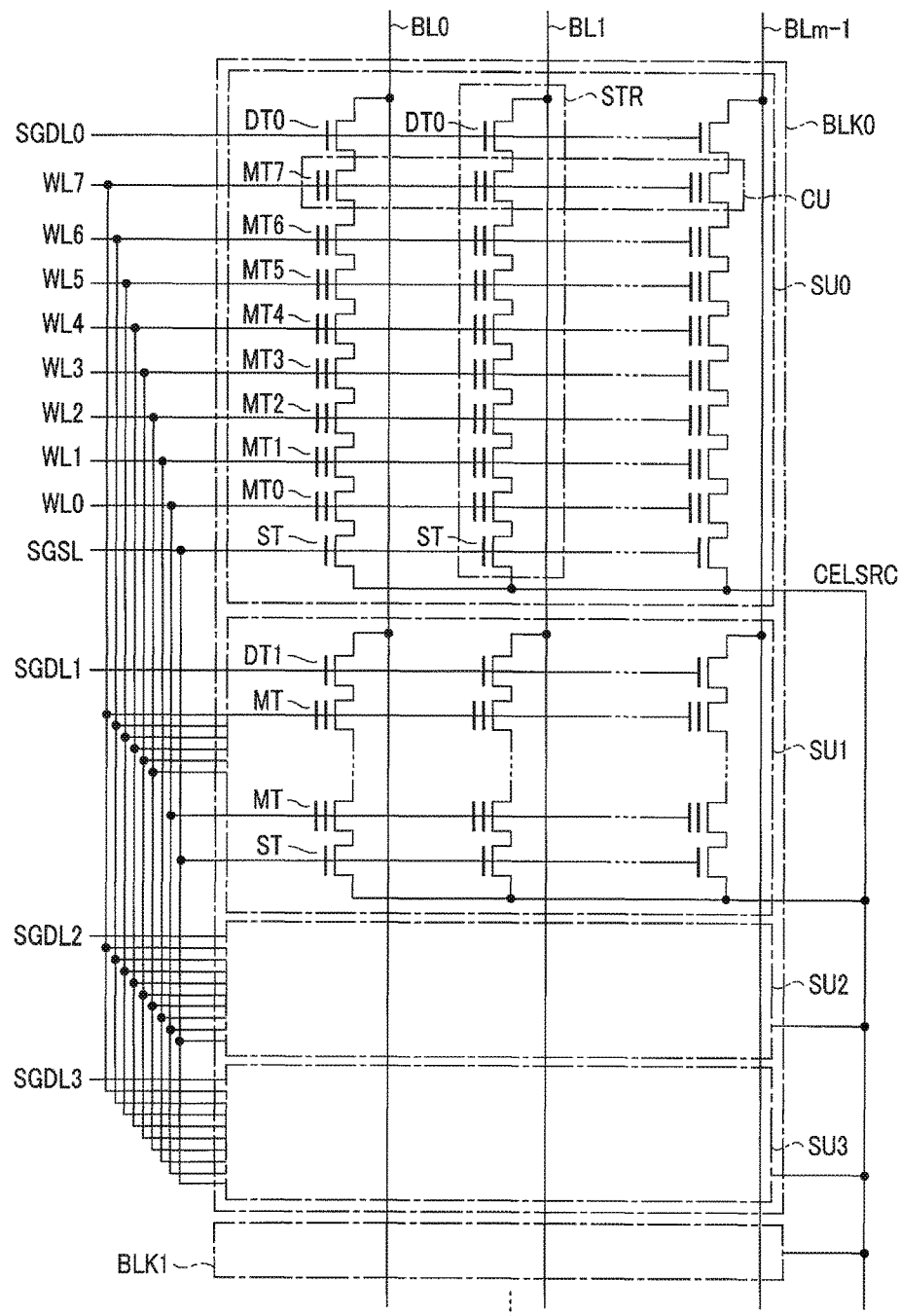
FIG. 3 illustrates an example of some components and connections of a memory cell array of the first embodiment.

FIG. 3 illustrates an example of some components and connections of the memory cell array 11 of the first embodiment, and illustrates components and connections of block BLK0 and associated components. Plural (for example, all) blocks ELK all include the components and connections illustrated in FIG. 3.

Each block ELK includes plural (for example, four) string units SU (SU0 to SU3).

Each of m (m being a natural number) bit lines BL0 to BLm−1 is coupled to respective strings STR from the four string units SU0 to SU3 in each block ELK.

Each string STR includes one select gate transistor ST, plural (for example, eight) cell transistors MT, and one select gate transistor DT (DT0, DT1, DT2, or DT3). The select gate transistor ST, the cell transistors MT, and the select gate transistor DT are coupled in series in this order between a source line CELSRC and one bit line BL. A cell transistor MT includes a control gate electrode (word line WL) and a charge storage layer insulated from the environment, and can store data in a non-volatile manner based on the quantity of the electric charge in the charge storage layer. A cell transistor MT has electrons injected into its charge storage layer by a write, and has electrons drawn out from the charge storage layer by an erasure.

Strings STR respectively coupled to different bit lines BL make one string unit SU. In each string unit SU, respective control gate electrodes of the cell transistors MT0 to MT7 are coupled to the word lines WL0 to WL7, respectively. Furthermore, in each block BLK, word lines WL with the same address in the different string units SU are also coupled to each other. A set of cell transistors MT which share one word line WL in one string unit SU is referred to as a cell unit CU. The cell transistors MT in one cell unit CU have data written in and read together. The memory space of one cell unit CU includes one or more pages.

The select gate transistors DT0 to DT3 belong to the string units SU0 to SU3, respectively. For each α (α being 0 or a natural number smaller than four), the gate of each select gate transistor DTα of each of strings STR in a string unit SUα is coupled to a select gate line SGDLα. The gates of the select gate transistors ST are coupled to a selected gate line SGSL.

Each block BLK may also include one string unit SU.

A block BLK can have any physical structure. Specifically, so-called a two-dimensional structure may be used where word lines WL of different addresses are lined up on the same surface of a silicon substrate, or a so-called three-dimensional structure may be used where plate word lines WL of different addresses are lined up vertically above the silicon substrate as illustrated in FIG. 4

Figure 4:
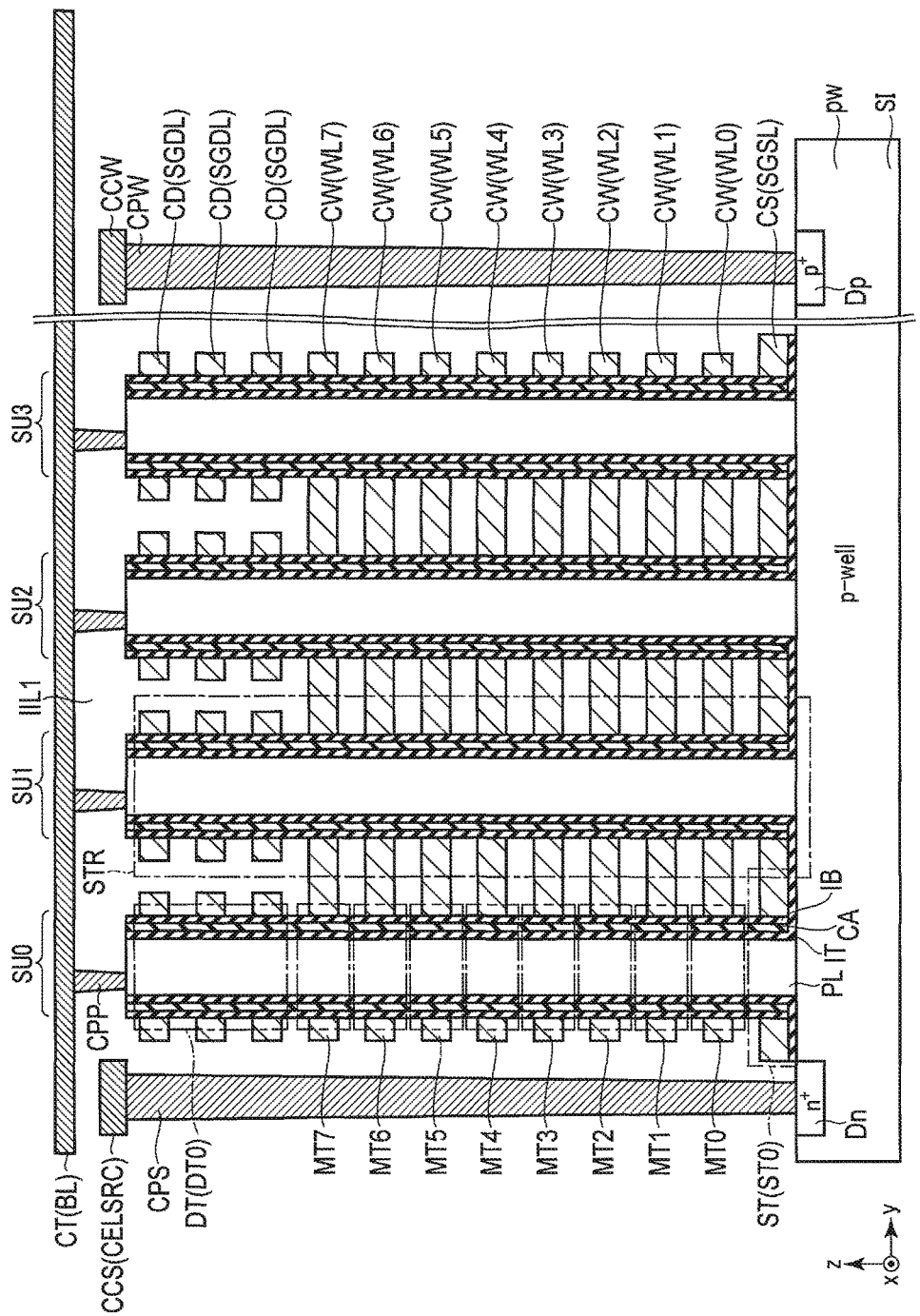
FIG. 4 illustrates an example of a structure of the block of the first embodiment.

FIG. 4 illustrates an example of the structure of one block, and each of the blocks BLK can have the structure illustrated in FIG. 4. As illustrated in FIG. 4, the string units SU are provided on a silicon substrate SI. The silicon substrate SI extends along the xy-plane, and includes a p-type well pw. The well pw is formed inside the silicon substrate SI, for example, by implanting ions to the entire surface of the silicon substrate SI. Each string unit SU includes strings STR lined up along the x-axis. Each string STR includes a semiconductor pillar PL. Each pillar PL extends along the z-axis, is in contact with the well pw at its bottom, and serves as a channel region in which channels of the transistors MT, DT, and ST are formed and a body. The top of the pillar PL is coupled to a conductor CT via a conductive plug CPP. The conductor CT extends along the y-axis, serves as one bit line BL, and has an interval with another conductor CT located at another coordinate on the x-axis. The side of the pillar PL is covered with a tunnel insulator (layer) IT. The tunnel insulator IT is also located on the well pw. The side of the tunnel insulator IT is covered with a charge storage layer CA. The charge storage layer CA is insulative or conductive, and has its side covered with a block insulator (layer) IB.

In each string unit SU, one conductor CS, plural (for example, eight) conductors CW, and plural (for example, three) conductors CD are provided above the well pw. Plural conductors CS may be provided. The conductors CS, CW, and CD are lined up in this order along the z-axis at intervals, extend along the x-axis, and are in contact with the block insulator IB. The conductor CS also sandwiches the tunnel insulator IT with the well pw. The conductors CS, CW, and CD serve as a select gate line SGSL, word lines WL0 to WL7, and a select gate line SGDL, respectively. In each string unit SU, the conductors CS, CW, and CD are at their insides in contact with the block insulators IB on the sides of all the pillars PL in that string unit SU.

A pillar PL, a tunnel insulator IT, a charge storage layer CA, and sections of a block insulators IB at crossings with the conductors CS, CW, or CD serve as a select gate transistor ST, a cell transistor MT, or a select gate transistor DT, respectively. The transistors ST, MT, and DT which share a pillar PL and are lined up along the z-axis make one string STR.

A diffusion layer of $p^+$-type impurities Dp is provided in the well pw. The diffusion layer Dp is coupled to a conductor CCW via a conductive plug CPW. The plug CPW extends along the xz-plane.

A diffusion layer of $n^+$-type impurities Dn is further provided in the well pw. The diffusion layer Dn is coupled to a conductor CCS via a conductive plug CPS. The conductor CCS serves as the source line CELSRC.

An area above the silicon substrate SI and free from the conductors CS, CW, CD, CCS, and CCW, and the plugs CPS and CPW is provided with an insulator IIL1.

<1.1.3.2. Cell Transistor>

Figure 5:
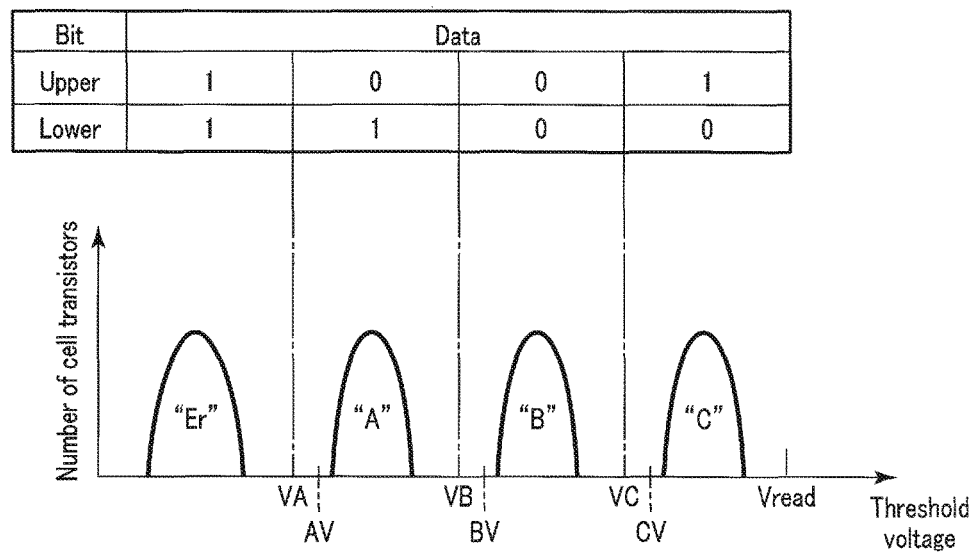
FIG. 5 illustrates an example of storing of data in a memory device of the first embodiment.

The memory device 100 can store data of one or more bits in one cell transistor MT. FIG. 5 illustrates distributions of threshold voltages of cell transistors MT each storing two-bit data as a result of a write. The threshold voltage of each cell transistor MT has a magnitude according to the stored two-bit data. Each cell transistor MT may have one of four threshold voltages.

Even cell transistors MT storing the same particular two-bit data may have different threshold voltages, and therefore the threshold voltages of the cell transistors MT storing the same data form a distribution. The cell transistors MT which belong to the four distributions are in Er-level, A-level, B-level, and C-level in order from the smallest level, respectively. The Er, A, B, and C-levels are treated as states storing, for example, data 11, data 01, data 00, and data 10, respectively. The Er-level corresponds to an erased state. In general, data is written in erased-state cell transistors MT.

The threshold voltages of the cell transistors of the A, B, and C-levels are higher than those of the cell transistors of Er, A, and B-levels, respectively. A cell transistor MT with a threshold voltage smaller than a read voltage VA is determined to be in the Er-level. A cell transistor MT with a threshold voltage larger than or equal to the read voltage VA and smaller than a read voltage VB is determined to be in the A-level. A cell transistor MT with a threshold voltage larger than or equal to the read voltage VB and smaller than a read voltage VC is determined to be in the B-level. A cell transistor MT with a threshold voltage larger than or equal to the read voltage VC is determined to be in the C-level. Each of the read voltage VA, VB, and VC may be referred to as a read voltage Vcgr. A voltage Vread is applied to the control gate electrode of a cell transistor MT which is not a target for a read, and is higher than the threshold voltages of any cell transistors MT.

In a case of storing plural-bit data in one cell transistor MT, a set of data in, among the two bits, same-digit bits of the respective cell transistors MT of one cell unit CU makes one page. Specifically, a set of the upper bits makes an upper page, and a set of the lower bits makes a lower page.

For verifying completion of a write, verification voltages AV, BV, and CV are used. The verification refers to determination on whether a write to to-be-written-in cell transistors MT has been completed. When a cell transistor MT to be written in the A, B, or C-level (selected cell transistors) respectively has a threshold voltage higher than or equal to the verification voltage AV, BV, or CV, the write to the cell transistor MT to be written in that level is determined to have been completed. The verification voltages BV and CV are higher than the verification voltages AV and BV, respectively. Each of the verification voltages AV, BV, and CV may be referred to as a verification voltage Vvf.

Data of three or more bits can be stored in one cell transistor by extending the principal described above. For a case of storing one-bit data in one cell transistor MT, any two levels of the FIG. 5 are used.

<1.2. Operation>

Prior to the description of operations of the memory system 1, generation of the error correction data based on the ECC circuit 25 is described.

<1.2.1. Operation of ECC Circuit>

Figure 6:
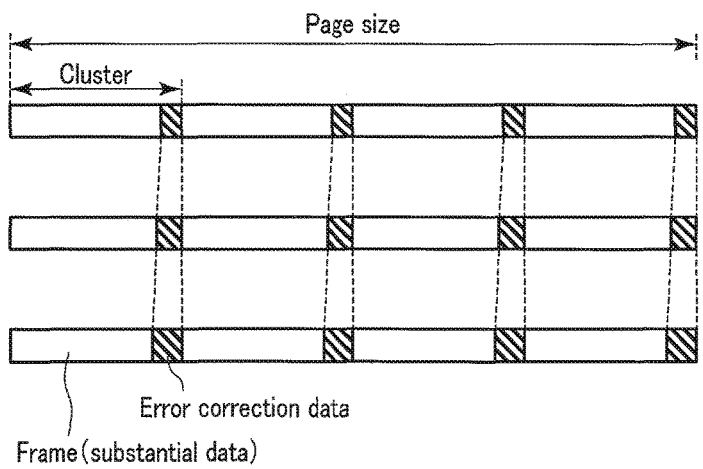
FIG. 6 illustrates an example of a ratio of sizes between substantial data and error correction data according to the first embodiment.

FIG. 6 illustrates an example of a ratio of sizes between substantial data and error correction data according to the first embodiment. The ECC circuit 25 can change the size of error correction data for particular substantial data to change the number of bits correctable in that substantial data as described above.

As illustrated in FIG. 6, the ECC circuit 25 divides received substantial data into segments (referred to as frames) of a particular size, and outputs the set of a frame and corresponding error correction data. The set of frame and corresponding error correction data is referred to as a cluster. The size of a cluster is fixed, and, for example, is as large as one of plural (for example, four) equally-sized segments of one page of the memory device 100. In contrast, the size of error correction data is variable based on the error correction capability required for the corresponding frame.

Therefore, the size of a frame is variable based on the error correction capability. The ECC circuit 25 divides to-be-written substantial data into plural frames of a size equal to the size of a cluster minus the size of the error correction data which realizes the error correction capability currently set for the ECC circuit 25. The ECC circuit 25 uses such a frame to generate corresponding error correction data. As a result, the set of error correction data of the size based on the error correction capability and a frame has the same size as a cluster.

The top section of FIG. 6 illustrates a case of error correction data generated with a method to realize the lowest error correction capability. The middle section of FIG. 6 illustrates a case of error correction data generated with a method to realize the intermediate error correction capability. The bottom section FIG. 6 illustrates a case of the error correction data generated with a method to realize the highest error correction capability. The higher a required error correction capability, the larger a size of the necessary error correction data, i.e., the smaller a frame. Therefore, the higher an error correction capability for error correction data used, the smaller the corresponding frame.

<1.2.2. Operation of Memory System>

Figure 7:
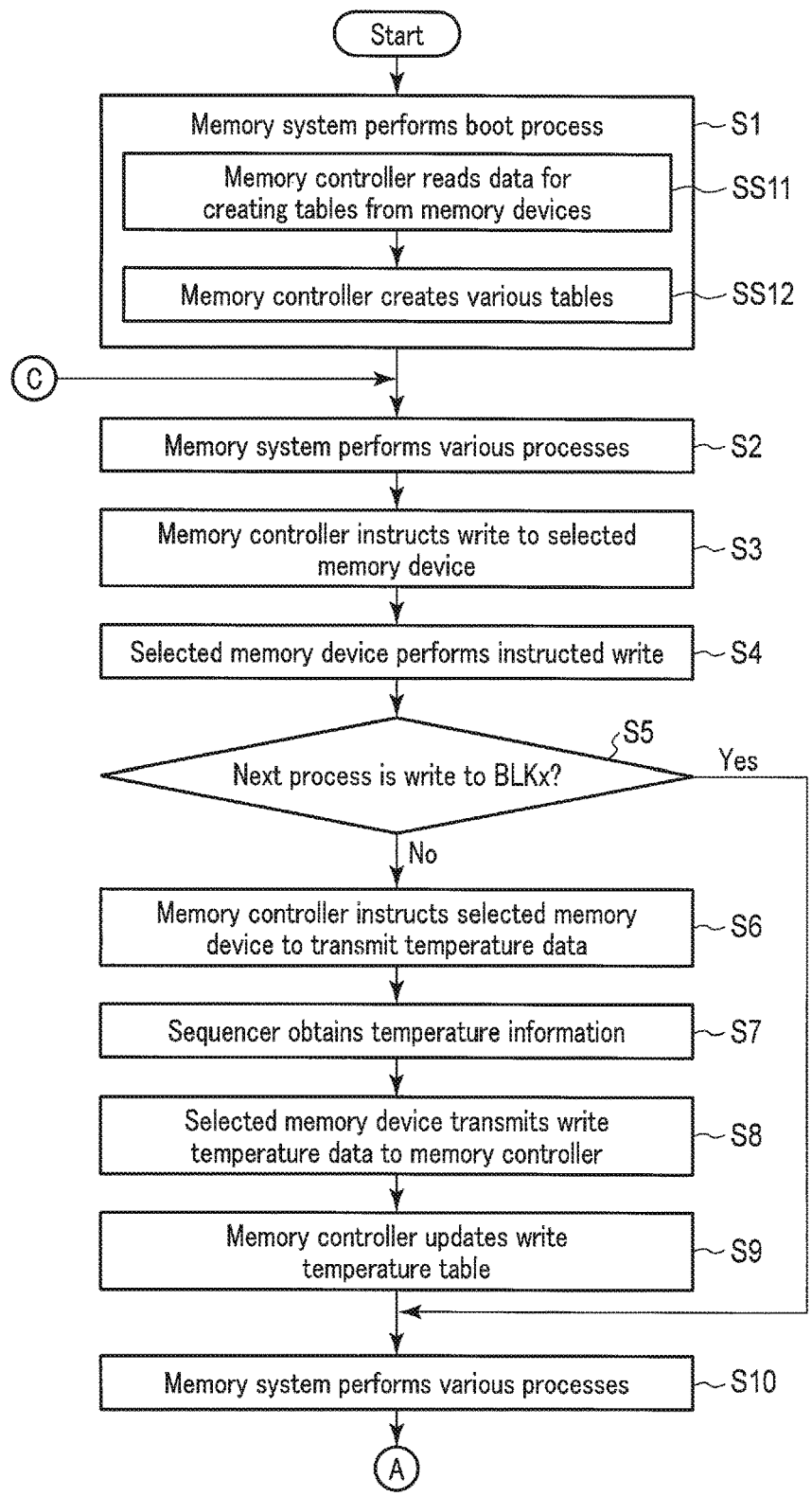
FIG. 7 illustrates a part of the flow of operation of the memory system of the first embodiment.
Figure 8:
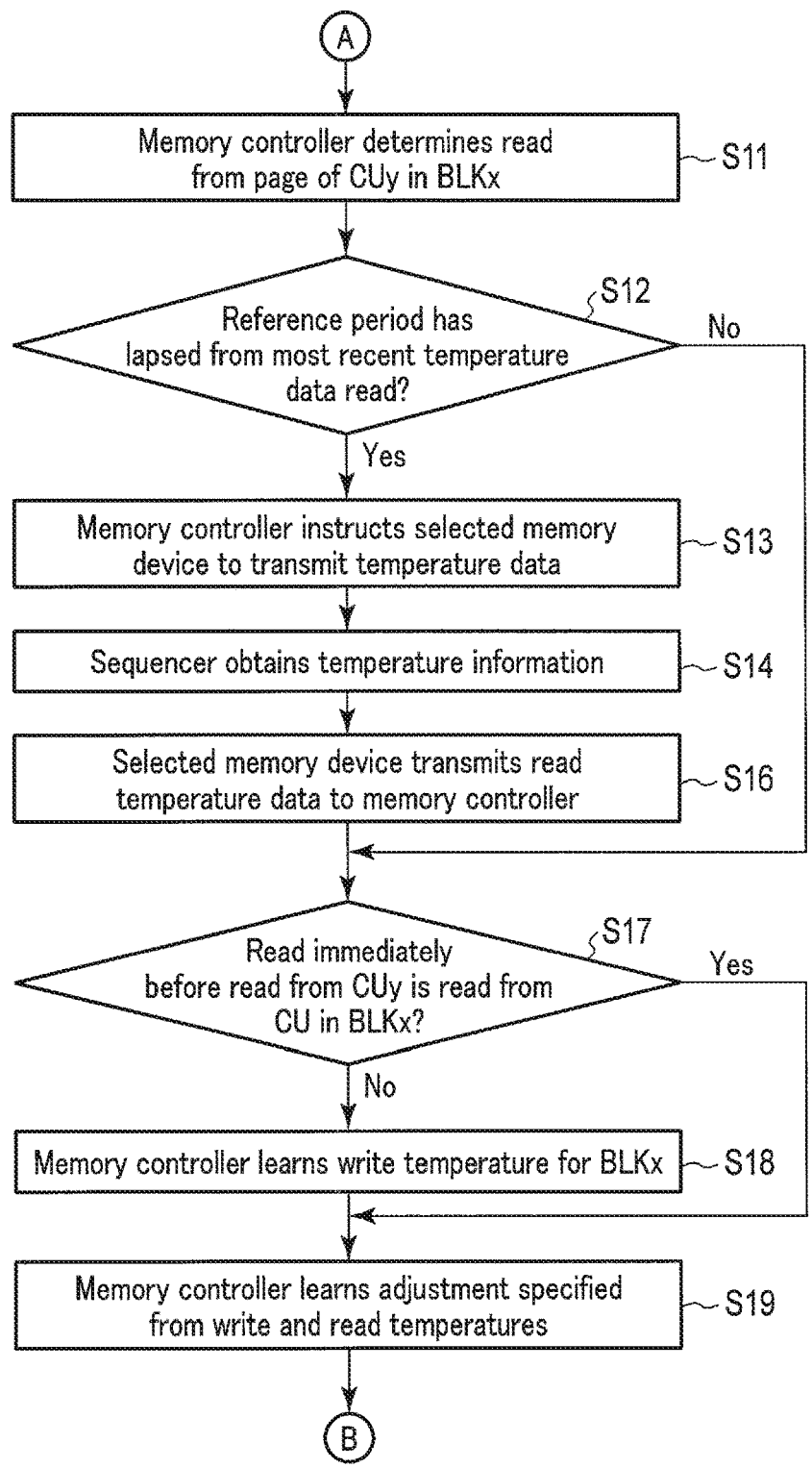
FIG. 8 illustrates another part of the flow of the operation of the memory system of the first embodiment.
Figure 9:
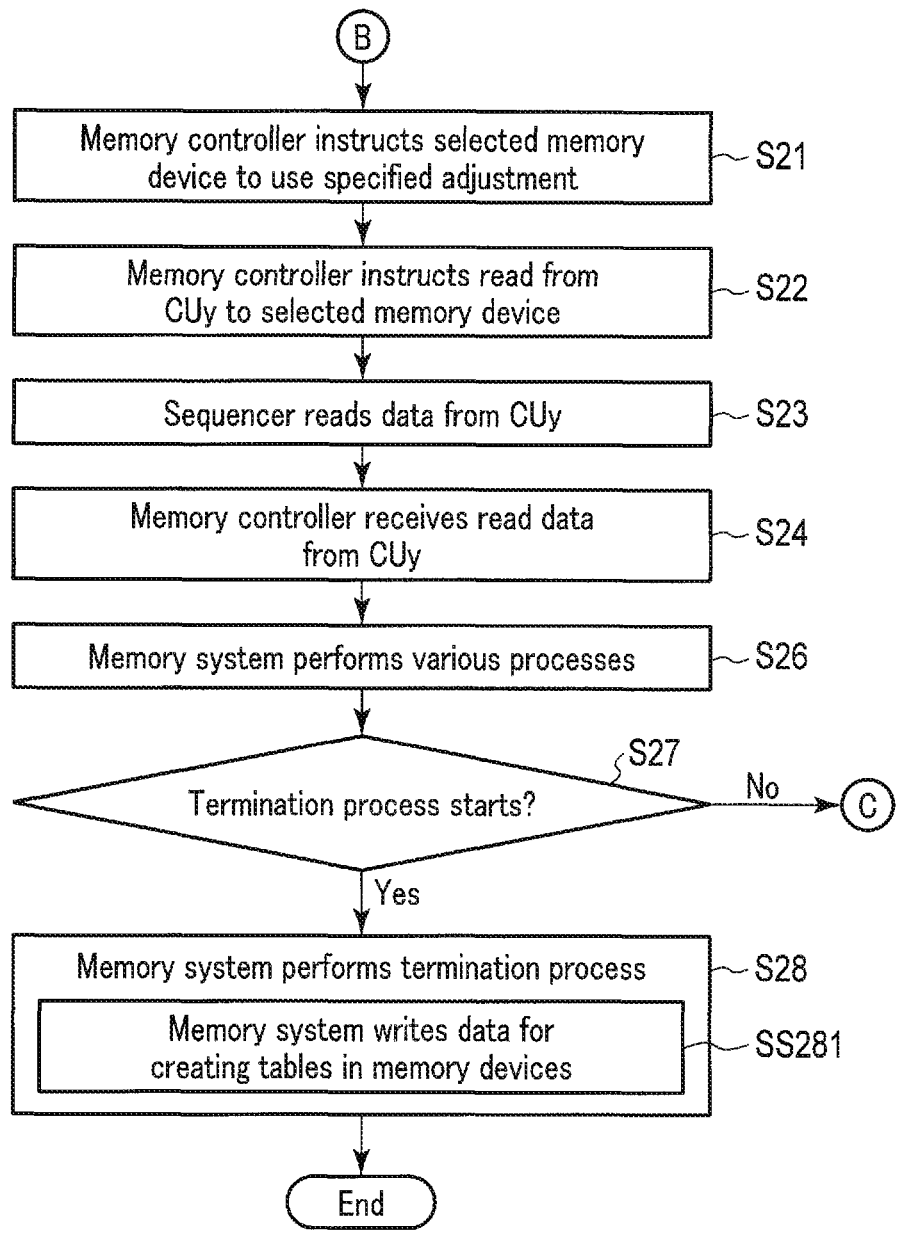
FIG. 9 illustrates still another part of the flow of the operation of the memory system of the first embodiment.

FIGS. 7 to 9 illustrate the flow of operation of the memory system 1 of the first embodiment. FIGS. 7 to 9 focus on processes relevant to a particular block BLKx (x being 0 or a natural number) of a particular memory device 100, or a selected memory device 100, in order to avoid an unnecessarily complicated flow.

As illustrated in FIG. 7, when the memory system 1 starts to receive supply of power and boots, it performs a boot process (step S1). The boot process refers to a required process necessary for the memory system 1 to be able to write and read data. The boot process includes creating various tables in the memory controller 200. Specifically, step S1 includes substeps SS11 and SS12.

Data necessary for creating the tables is stored in one or more blocks BLK in each memory device 100, and the memory controller 200 reads necessary data from those blocks BLKs (substep SS11). In substep SS12, the memory controller 200 uses the read data to create tables for each memory device 100 on the RAM 23. The tables to be created include temperature combination tables illustrated in FIG. 10, write temperature table illustrated in FIG. 13, and the address mapping table. The temperature combination tables and the write temperature table for each memory device 100 are included in the memory device temperature information 231 for that memory device 100. One temperature combination table may also be used in common for plural memory devices 100.

FIG. 10 illustrates temperature combination tables for a particular memory device (for example, the selected memory device) 100. As illustrated in FIG. 10, plural temperature combination tables exist. Each temperature combination table of the present embodiment indicates information for one of parameters used in reads from the memory device 100. Examples of the parameters for which temperature combination tables are prepared include, but are not limited to, the voltage Vread and the read voltage Vcgr described above.

Each temperature combination table has plural values, and the values are associated in a two-dimensional matrix form. One dimension (along a vertical direction) relates to a temperature measured in the temperature sensor 17 upon a write to the selected memory device 100, or a write temperature. The other dimension (along a horizontal direction) relates to a temperature measured in the temperature sensor 17 upon a read from the selected memory device 100, or a read temperature.

Different rows are associated with different write temperatures, and each row indicates plural values for the associated write temperatures. The write temperature in each row has a particular difference from the temperature in the next row on the lower side. For example, the difference between vertically adjacent write temperatures is 10° C., and TW0 to TW8 are 0, 10, 20, 30, 40, 50, 60, 70, and 80° C., respectively, for example. A write temperature and a difference other than this example may also be used.

Similarly, different columns are associated with different read temperatures, and each column indicates plural values for the associated read temperature. The read temperature in each column has a particular difference from the temperature in the next column on the right side. The set of read temperatures may be the same as or different from that of write temperatures. For example, the difference between horizontally adjacent read temperatures is 10° C. as in the write, and TR0 to TR8 are 0, 10, 20, 30, 40, 50, 60, 70, and 80° C., respectively. A read temperature difference other than this example may also be used.

The intersection of each row and each column has one adjustment $\Delta A$ ($\Delta A0$, $\Delta 1$, $\Delta A2$, ..., $\Delta A88$). The values in a particular table indicate adjustments, or the offsets, from the default value of the parameter associated with that table. A default value refers to the value used in the initial state (or, state with no adjustment made) of the memory device 100. Each adjustment $\Delta A$ indicates the adjustment for a case of a write at the write temperature of the row of that adjustment $\Delta A$ and a read at the read temperature of that adjustment $\Delta A$. Each adjustment $\Delta A$ is set based on the characteristics of the selected memory device 100 at the corresponding write temperature, and the characteristics of the selected memory device 100 at the corresponding read temperature. Specifically, each adjustment is set to allow for a read optimized for the temperature when the sum of that adjustment and the default value is used for the corresponding parameter at the corresponding write and read temperatures.

Each adjustment $\Delta A$ is positive, negative, or zero. Each adjustment $\Delta A$ may be the same as or different from another adjustment $\Delta A$.

The adjustments $\Delta A$ may be determined by a function, instead of prepared for discrete plural write temperatures and discrete read temperatures as described above. FIG. 11 illustrates another example of the relationships between the write temperatures and the adjustments $\Delta A$ of the first embodiment. As illustrated in FIG. 11, the correspondences between the write temperatures and adjustments $\Delta A$ for each of discrete plural read temperatures (0° C., 50° C., and 80° C. shown by way of example) are set by, for example, linearity functions. For example, functions for different read temperatures have different characteristics (for example, inclinations). In a read, at, for example, 50° C., the memory controller 200 can refer to the function for the 50° C. read to determine the adjustment $\Delta A$ at the corresponding write temperature. In place of or in addition to the functions for the read temperature of 0° C., 50° C., and 80° C., a function for one or more other read temperatures may be prepared. Furthermore, the correspondences between the read temperatures and adjustments $\Delta A$ for each of discrete plural write temperatures (for example, 0, 50, and 80° C.) may be set by functions. In this case, a function corresponding to a write temperature is referred to, and an adjustment $\Delta A$ at a corresponding read temperature is determined. The functions described above may be set for one or more memory devices 100 manufactured in the same manufacturing process, or unique for one or more memory devices 1 or for one or more blocks BLK.

Figures 12, 13:
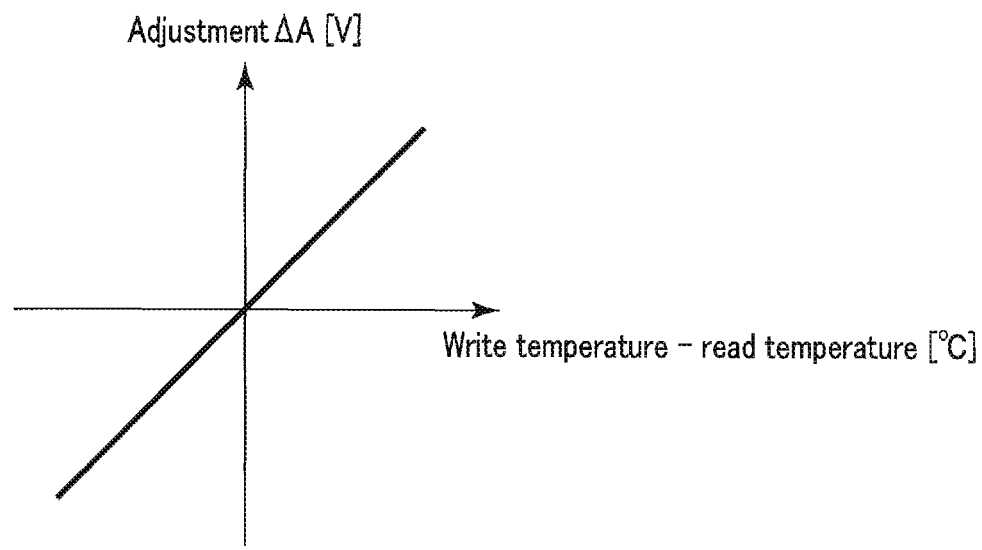
FIG. 12 illustrates relationships between the differences between write temperatures and read temperatures and adjustments according to the first embodiment.
FIG. 13 illustrates a write temperature table according to the first embodiment.

Adjustments ΔA may also be based on a difference between a write temperature and a read temperature (write temperature minus read temperature), or the correspondences between differences between write and read temperatures (write and read temperature differences) and the adjustments ΔA may be based on a function as shown in FIG. 12.

Plural temperature combination tables may also be prepared for a particular parameter (for example, the voltage Vcgr). In this case, one of the different temperature combination tables is selected based on the value of another parameter. Specifically, erasures for each block are counted, and/or reads from one cell unit CU in a particular block BLK are counted for each block, for example. A temperature combination table for the voltage Vcgr is prepared for each range of counts of erasures and/or each range of counts of reads. In a read, the counts of erasures and/or reads of a target block BLK are referred to, and an adjustment ΔA is selected from the temperature combination table corresponding to the referred-to counts of erasures and/or reads.

FIG. 13 illustrates a write temperature table for a particular memory device (for example, selected memory device) 100. As shown in FIG. 13, the write temperature table indicates a correspondence between the address of each block BLK and the write temperature for that block BLK obtained from the temperature information measured upon a write to a cell unit CU in that block BLK. In many cases, the memory system 1 has data sequentially written in plural cell units CU, especially those in one block ELK as a typical example. Such writes are completed in the selected memory device 100 in a short period, and therefore the temperature of the temperature sensor 17 is substantially constant during the writes to cell units CU in one block BLK. For this reason, the address of each block BLK is associated with one temperature upon a write to that block ELK, as shown in FIG. 13. More specifically, the write temperature for a particular block BLK is associated with the write temperature upon a write to one cell unit CU in that block BLK. Each write temperature in the write temperature table is one in a set of the same plural temperatures as discrete plural write temperatures used in the temperature combination table.

In the present embodiment an example of management of a write temperature for every block BLK is described; however a write temperature can be managed in any units. For example, a write temperature can be managed for each set of blocks BLK, or each cell unit CU, or each set of cell units CU. Furthermore, a write temperature can be managed for one or more blocks BLK over plural memory device 100.

Whenever a write to an erased block BLK occurs while the memory system 1 is ON with a power supplied, the memory controller 200 obtains the write temperature corresponding to that block BLK and updates the write temperature table with the obtained write temperature. This aspect will be described in full detail below. When the memory system 1 has the power supply stopped and turns off, the memory controller 200 writes data necessary for creating the write temperature table in the memory device 100 upon being turned off. This aspect will also be described in full detail, including details of data necessary for creating the write temperature table.

Referring back to FIG. 7, the memory system 1 performs various processes following step S1 (step S2). Such various processes include a read and/or a write to a block ELK other than the block BLKx, for example.

In step S3, the overall controller 22 controls the memory interface 24 to instruct a write of write data with a one-page size to the memory device 100. This instruction may be transmitted based on a write instruction from the host device 2 or in garbage collection, or no instruction from the host device 2 in order for the memory controller 200 to write management data in the memory device 100. For the write, the overall controller 22 divides the substantial data which will be written in the memory device 100 into frames of the size determined based on the required error correction capability. The required correction capability may be based on the nature of the substantial data, or the reliability of the cell unit CU in which the substantial data will be written. The overall controller 22 then controls the ECC circuit 25 to generate error correction data for each frame to prepare write data including frames and error correction data.

A write instruction includes a signal specifying a page, a write command, an address signal, and a write execution command, for example. The address signal specifies the address of the cell unit CU in the block BLKx in which the write data will be written, and the signal specifying a page specifies the page in which the write data will be written. In actuality, for a case of two-bit write in one cell transistor MT, write instructions for two pages are transmitted.

When the selected memory device 100 receives the write instruction, the sequencer 12 controls the potential generator 13, the driver 14, the row decoder 15, and the sense amplifier 16, to write the write data in the selected cell unit CU (step S4).

Upon completion of the write, the memory controller 200 determines whether the process instructed following the instruction at step S3 is a write to the block BLKx (step S5). When the process following step S3 is not a write to the block BLKx (No branch of step S5), the memory controller 200 instructs the memory device 100 to transmit temperature data (step S6). When instructed to transmit the temperature data, the sequencer 12 obtains the temperature information MND from the temperature sensor 17 (step S7). The sequencer 12 then transmits data indicating the temperature included in the obtained temperature information MND, or the temperature data, to the memory controller 200 (step S8). The transmitted temperature data is temperature data including the write temperature upon the write for the block BLKx, or write temperature data.

Upon reception of the write temperature data, the memory controller 200 updates the write temperature table (step S9). Specifically, the memory controller 200 stores the write temperature indicated in the write temperature data as the write temperature for the block BLKx in the write temperature table. Step S9 continues at step S10.

When the memory controller 200 determines that the process following step S3 is a write to the block BLKx in step S5 (Yes branch), the flow goes to step S10 without passing through steps S6, S7, S8, and S9.

In step S10, the memory system 1 performs various processes as in step S2. The various processes include a write to another cell unit CU in the block BLKx, for example. With the process of step S10 including a write to a new block BLK other than the block BLKx, the memory controller 200 performs the same processes as steps S6 to S9 for every write to a new block BLK, and updates the write temperature for that new block BLK in the write temperature table.

Following step S10, the memory controller 200 determines to read data from a page of a particular cell unit CUy (y being 0 or a natural number) in the block BLKx of the selected memory device 100 (step S11). The determination of the read may be based on a read instruction from the host device 2 or the garbage collection, or based on determination that the memory controller 200 will read the management data from the selected memory device 100 without being based on instructions from the host device 2. When a read is necessary, the memory controller 200 specifies the page which stores the to-be-read data and the cell unit CU which provides the memory space of that page. In step S11, as a result of the determination, the memory controller 200 determines that a read from the cell unit CUy is required. Note that, in the storing of one-bit data in one cell transistor MT, specifying a page is the same as specifying a cell unit CU.

In step S12, the memory controller 200 determines whether a reference period has lapsed from the most recent time when the temperature data was read (step S12). With the reference period having lapsed (Yes branch of step S12), the latest temperature data based on the current temperature is necessary. To this end, the memory controller 200 transmits a temperature data transmission command to the selected memory device 100 (step S13).

Upon reception of the temperature data transmission command, the sequencer 12 obtains the temperature information MND from the temperature sensor 17 (step S14). The sequencer 12 then transmits data indicating the temperature included in the obtained temperature information MND to the memory controller 200 (step S16). The transmitted temperature data is temperature data including the read temperature upon the read for the block BLKx, or read temperature data. Step S16 continues at step S17.

When the reference period has not lapsed from a time when the temperature data was read most recently (No branch of step S12), the most-recently obtained temperature data can be used as the read temperature data. Based on this, the flow goes to step S17. For example, for a case where the temperature data was obtained in the last process among the various processes in step S10, the reference period has not lapsed from the most recent time of read of the temperature data.

In step S17, the memory controller 200 determines whether the process immediately before the read from the cell unit CUy is a read from a cell unit CU in the block BLKx. Without a read from the block BLKx (No branch of step S17), the memory controller 200 refers to the write temperature table to obtain the write temperature for the block BLKx (step S18). Step S18 continues at step S19. In contrast, with a read from the block BLKx (Yes branch of step S17), the flow goes to step S19 without passing through step S18. The set of steps S17 and S18 may precede the set of steps S12 to S16.

In step S19, the memory controller 200 refers to the temperature combination table to obtain the adjustment ΔA specified from the read and write temperatures for the block BLKx. The temperature combination table used is one for a parameter which the memory controller 200 wishes to adjust. For adjusting plural parameters, the temperature combination table for each parameter is referred to, and the adjustment ΔA for each parameter is specified. For a case where a function described with reference to FIG. 11 or 12 is used, the memory controller 200 obtains the adjustment ΔA specified from the read and write temperatures for the block BLKx and the function.

The memory controller 200 instructs the selected memory device 100 to use the specified adjustment ΔA (step S21). Specifically, the memory controller 200 transmits to the memory device 100 a command which specifies the to-be-adjusted parameter and the adjustment ΔA to be added to the default value of that parameter.

The memory controller 200 transmits an instruction to read data from a page of the cell unit CUy in the block BLKx to the selected memory device 100 (step S22). The instruction includes a read command, an address signal specifying the cell unit CUy in the block BLKx, a signal specifying the page, and a read execution command, for example. The application of the adjustment ΔA in step S21 is valid only for the subsequent instruction, or, the read instruction in step S22 in this example.

When the selected memory device 100 receives the read instruction, the sequencer 12 reads the data in the read-target page of the cell unit CUy (step S23). In the read, the sequencer 12 uses the sum of the adjustment ΔA instructed to be applied and the default value of the parameter for which that adjustment ΔA is prepared. For this reason, even in reads from the same particular cell unit CU, the value for a particular parameter used for reads varies based on the combination of the read temperature and the write temperature for the block BLK which contains that cell unit CU. The read data is transmitted from the selected memory device 100 and received by the memory controller 200 (step S24). The memory system 1 then performs various processes as in step S2 (step S26).

After step 326, the flow goes back to step S2 unless a termination process for the memory system 1 to turn off starts (No branch of step S27). The termination process refers to a process for the memory system 1 to turn off, and starts by notification of start of stop of the power supply to the memory system 1 from the host device 2. When the termination process starts (Yes branch of step S27), the memory system 1 performs the termination process (step S28). The termination process includes writing data to create tables including the temperature combination tables and the write temperature table in each corresponding memory device 100 (substep SS281). The data to create the temperature combination tables and the write temperature table may be periodically written in each memory device 100 before the termination process starts while the memory system 1 is receiving the power supply from the host device 2.

Figure 14:
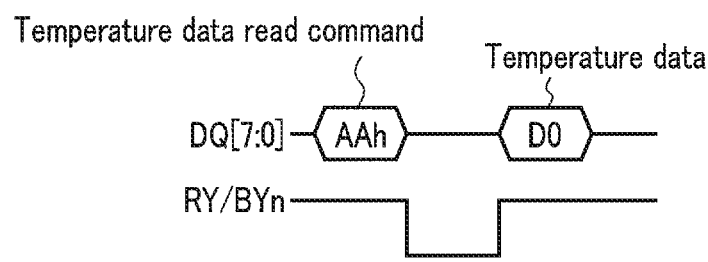
FIG. 14 illustrates a first example of signals DQ transmitted and received for obtaining thermal data according to the first embodiment.

Referring to FIG. 14, description will be given of the signals DQ transmitted and received between the memory controller 200 and the selected memory device 100 for transmitting an instruction for temperature data transmission and transmitting the temperature data (for example, steps S6 and S7 of FIG. 7). FIG. 14 illustrates the signals DQ transmitted and received between the memory controller 200 and the selected memory device 100 for obtaining the temperature data according to the first embodiment over time. As illustrated in FIG. 14, the memory controller 200 transmits a temperature data read command AAh. Upon reception of the temperature data transmission command, the sequencer 12 obtains the temperature information MND from the temperature sensor 17. The sequencer 12 transmits the ready busy signal RY/BYn of the low level during obtaining the temperature information MND. The sequencer 12 transmits to the memory controller 200 the information on the temperature included in the obtained temperature information MND as the temperature data DO.

Figure 15:
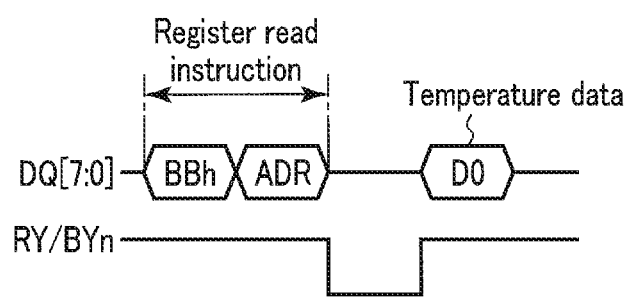
FIG. 15 illustrates a second example of the signals DQ transmitted and received for obtaining the thermal data according to the first embodiment.

The read of temperature data can also be performed by transmission of signals illustrated in FIG. 15. As illustrated in FIG. 15, the memory controller 200 transmits a register read instruction to read the data temperature. The register read instruction includes a register read command BBh and an address signal ADR. The register read command BBh instructs a read of the data in the register 121. The address signal ADR specifies a read-target area in the register 121. For reading the temperature data, the memory controller 200 specifies the area which stores the temperature information MND with the address signal ADR. Upon reception of the register read command BBh and address signal ADR, the sequencer 12 obtains the data temperature information MND currently stored in the area specified by the address signal ADR in the register 121. The sequencer 12 transmits the ready busy signal RY/BYn of the low level during obtaining the temperature information MND. The sequencer 12 transmits to the memory controller 200 the temperature information included in the obtained temperature information MND as the temperature data D0.

Figure 16:
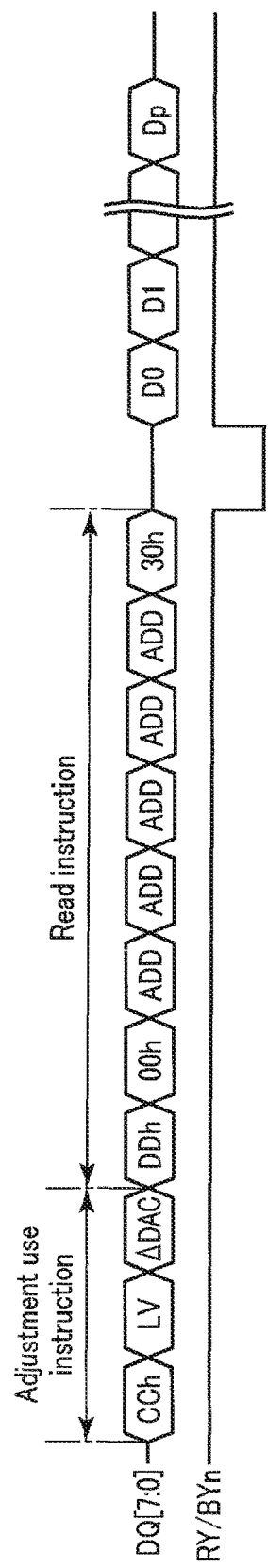
FIG. 16 illustrates the signals DQ transmitted and received for instructing use of an adjustment and a read according to the first embodiment.

Referring to FIG. 16, description will be given of signals DQ transmitted and received between the memory controller 200 and the selected memory device 100 for instructing the memory device 100 to use an adjustment and a read (for example, steps S21 and S22 of FIG. 9). FIG. 16 illustrates the signals DQ transmitted and received between the memory controller 200 and the selected memory device 100 for instructing use of the adjustment and reading in the first embodiment over time. FIG. 16 illustrates an example of the signals DQ for a case of one of read voltages Vcgr being adjusted.

As illustrated in FIG. 16, in order to instruct the use of the adjustment, the memory controller 200 transmits a command CCh which instructs use of an adjustment. The memory controller 200 then specifies which of the read voltages VA, VB, and VC will be adjusted (LV), and then transmits a signal which indicates an adjustment ΔDAC. The adjustment ΔDAC specifies the adjustment Δ determined from the write and read temperatures for the block BLK which contains a read-target cell unit CU with a digital value. For a case of using plural read voltages VA and VC for a read from one page such as a lower page being necessary, the adjustment ΔDAC is used in common to the read voltages VA and VC. Alternatively, when different read voltages Vcgr are provided with different sets of adjustments, or different temperature combination tables, a set of the command CCh, the signal LV specifying a target level, and an adjustment ΔDAC is transmitted for each read voltage Vcgr.

The memory controller 200 transmits a read instruction after transmission of the last adjustment ΔDAC. The read instruction includes a command DDh, a read command 00h, an address signal ADD of a read-target cell unit CU, and a read execution command 30h. The command DDh specifies a read-target page among the pages provided by the memory space of a cell unit CU specified by the address signal ADD. The address signal ADD specifies a cell unit CU. With the read execution command 30h received, the selected memory device 100 transmits the ready busy signal RY/BYn of the low level, and then transmits the specified data D0 to Dp (p being a natural number) to the memory controller 200.

Figure 17:
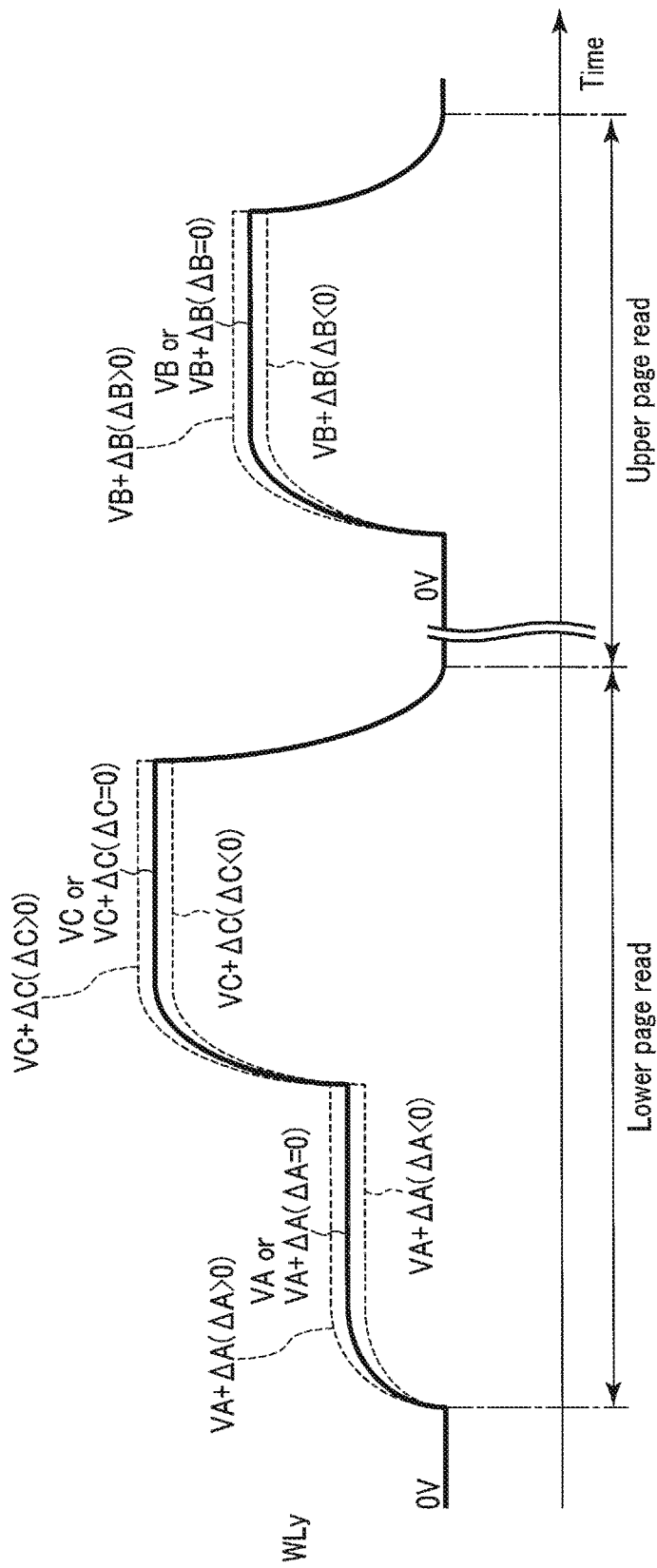
FIG. 17 illustrates voltages applied to a selected word line in a read in the first embodiment.

Referring to FIG. 17, the read of data from the read-target page (step S23) is further described. FIG. 17 illustrates voltages applied to a selected word line WLy coupled to the cell unit CUy during a read in the first embodiment over time. FIG. 17 illustrates both a read from a lower page and a read from an upper page. In actuality, among the lower and upper pages of the cell unit CUy, either read determined as a read-target in step S11 occurs in step S23.

In FIG. 17, the adjustment ΔA represents a specific value specified from the set of the write and read temperatures for the block BLKx in the temperature combination table for specifying the adjustment of the read voltage VA. Similarly, the adjustments ΔB and ΔC also represent specific values in the temperature combination tables for specifying the adjustments of the read voltages VB and VC, respectively.

Alternatively, for the read voltages VA, VB, and VC, one common temperature combination table may be prepared and a common value for each combination of the write and read temperatures may be applied. In other words, adjustments ΔA, ΔB, and ΔC are equal for each combination of the write and read temperatures.

FIG. 17 illustrates cases where each of the adjustments ΔA, ΔB, and ΔC is positive, negative, and zero.

As illustrated in FIG. 17, in a read from a lower page, the sequencer 12 applies the sum of the default read voltage VA and the adjustment ΔA to the word line WLy instead of the default read voltage VA. For a case of zero adjustment ΔA, the sequencer 12 applies the default voltage VA to the word line WLy.

Further, the sequencer 12 applies the sum of the default read voltage VC and the specified adjustment ΔC to the word line WLy instead of the default read voltage VC. For a case of zero adjustment ΔC, the sequencer 12 applies the default voltage VC to the word line WLy.

In a read from an upper page, the sequencer 12 applies the sum of the default read voltage VB and the specified adjustment ΔB to the word line WLy instead of the default read voltage VB. For a case of zero adjustment ΔB, the sequencer 12 applies the default voltage VB to the word line WLy.

<1.3. Advantages>

According to the first embodiment, the memory controller 200 can control the memory device 100 more appropriately. Details are as follows.

In general, the characteristics of a semiconductor depend on the temperature thereof, and therefore the characteristics of a memory device which uses the semiconductor also depend on the temperature of the memory device. For this reason, the optimum values for a particular parameter are different at different temperatures. In actuality, however, a memory device uses an optimum value for a particular temperature for each parameter at different temperatures. Therefore, at a temperature different from that for which the optimization is made, the memory device may be unable to perform optimum operation. When the memory device operates using a non-optimum value for a particular parameter, it may cause a result different from what it would be with the optimum value. This may result in incorrect writes and/or reads of data when the memory device operates at a temperature other than the temperature for which the optimization is made. The narrower the range of temperature in which the memory device is used, the less likely the incorrect writes and/or reads of data.

A memory system including a memory device, such as the memory system 1, may be, however, used in a wide temperature range. This means that the memory device may operate at a temperature significantly different from the optimization-target temperature, which in turn may cause frequent incorrect writes and/or reads.

The characteristics of reads in the memory device may also be influenced by writes. For example, as a result of applying a program voltage to a cell transistor MT with a threshold voltage slightly lower than a verification voltage (AV, BV, or CV) in a write at a particular temperature, the threshold voltage of that cell transistor MT may rise too much at some temperature in the write. As such, even if a read is performed based on the temperature of the memory device in the read, the optimization may be insufficient. Specifically, a read of particular data with a value adjusted for a particular first temperature may be optimum if that data was written at a particular second temperature but not at a third temperature.

According to the first embodiment, the memory controller 200 stores a temperature combination table, specifies one adjustment (ΔA) from the combination of write and read temperatures for a block BLKx, and instructs the memory device 100 to use the sum of the adjustment and the default value of the corresponding parameter. Each adjustment is preset to allow for a read optimized at least for the temperature when the sum of that adjustment and default value for the corresponding parameter at corresponding write and read temperatures is used. Thus, each adjustment is based on both the temperature in a read of particular read data and the temperature when that read data was written. Therefore, data can be read more optimized for the temperature. This can reduce the variation in performance of the memory system 1 based on the temperature from that by a memory system which uses a parameter value optimized at a fixed value of the temperature.

The reduction of the variation of performance based on the temperature of the memory system 1 can increase the life of the memory system 1. Details are as follows. In general, values for various parameters of a memory device are optimized for a fixed particular temperature as described above. For this reason, when a write or read temperature differs from the temperature at which the optimum value of a parameter is preset, read data includes many errors. In addition, the larger the difference between read and write temperatures, the larger the error rate of read data. When the memory controller 200 detects such a high error rate, it determines that the cell unit CU storing the read data has greatly deteriorated. When the memory controller 200 erases the data and then writes other data in the deteriorated cell unit CU, it uses error correction data which can correct more errors. For example, it changes from a write with the error correction data of the size shown in the top section of FIG. 6, to a write with the error correction data of the size shown in the middle or bottom sections of FIG. 6. This results in reduced frame sizes, and a reduced capacity of data which can be stored in the memory device 100.

The more the reduced frames, the more the number of data writes or reads of the memory device 100 necessary for the memory controller 200 and the memory device 100 to read or write data. This degrades the memory system 1 and reduces the life thereof.

According to the first embodiment, data can be read more optimized for the temperature as described above, which suppresses an increase of the error rate of read data and by extension the reduction of frames. This results in suppressing the increase of the numbers of reads and writes of data in the memory device 100, and by extension can increase the life of the memory system 1. For the same reasons, erroneous determination that the memory system 1 is easy to deteriorate in examination before shipment of the memory system 1 can be avoided, which improves the yield of the memory systems 1.

<1.4. Modifications>

So far, the description has been given of an example where the write and read temperatures are obtained when a particular condition is fulfilled during a write and a read. Instead, however, the memory controller 200 may obtain the temperature data from the selected memory device 100 periodically. For example, in a data read, the memory controller 200 uses the temperature data obtained last time as the read temperature data for that read. The same holds true for a write and erasure. For the write and erasure, the first temperature data after the instruction of that write or erasure may also be used.

The use of an adjustment added to the default value of a parameter has been described; however the adjustment of parameters fixed as default by changing the parameters dynamically is only needed in the first embodiment. For example, new special parameters, such as one generated according to the characteristics at a high temperature write and a low-temperature read, or a low temperature write and a high temperature read, can be generated and used. In this case, the sum of the adjustment and the default value is not calculated, but a special parameter generated or selected is used as it is.

It is known that data with a high priority is written in an area comparatively reliable from a viewpoint of the data protection in the memory cell array 11 as measures against problems due to a temperature change other than the parameter adjustment, for example. Such a write may be combined with the first embodiment. The comparatively reliable areas from a viewpoint of data protection include SLC blocks, which are used to store one-bit data in one cell transistor MT, blocks ELK in which data are written in every other word line, and areas protected by an advanced error correction function.

Examples of the predetermined area protected by an advanced error correction function include user-data areas in the same page with error correction data occupying of the area much, such as with a method of implementing the highest error correction capability shown in the bottom section of FIG. 6, and user-data areas part of which is used for storing the parity.

As measures against problems due to a temperature change other than the parameter adjustment, it is effective to perform a refresh process to an access-target block ELK when the two temperatures are relatively largely different from each other. For example, it is effective to refer to the temperature upon the write and perform the refresh process when the read temperature differs from the write temperature by a magnitude larger than a threshold, and to perform the refresh process when the temperature rises or falls back to a temperature within a preset range (for example, a room temperature) after a write at a temperature higher than an upper limit or lower than a lower limit over time.

The refresh process can be performed through dynamic change of the priority of the garbage collection as the whole memory system 1 with the conditions described above, or after interrupting a progressing read when the count of read requests from the host device 2 reaches a threshold. Such refresh may be combined with the first embodiment.

The temperature combination table can be included in firmware. In this case, the write of the temperature combination tables in the memory device 1 every time the memory system 1 turns off is unnecessary.

Second Embodiment

The second embodiment is similar to the first embodiment, and temperatures upon erasure (erasure temperatures) are used in addition to or instead of the write temperatures.

The following description relates to an example where the erasure temperatures are used in addition to the write temperatures. An example of use of the erasure temperatures instead of the write temperatures is the first embodiment with the write temperatures replaced with the erasure temperatures, and therefore no description is given of this.

<2.1. Configuration>

The memory system 1, the memory controller 200, and the memory device 100 of the second embodiment have the same components and connections as those of the first embodiment. In contrast, the memory controller 200 and the memory device 100 in the second embodiment are configured to perform the operations described in the following.

<2.2. Operation>

The memory controller 200 stores tables illustrated in FIGS. 18 and 19 for each memory devices 100, while the memory system 1 is ON. FIG. 18 illustrates a set of temperature combination tables according to the second embodiment, and illustrates plural temperature combination tables for one parameter. The memory controller 200 stores plural sets of temperature combination tables the same as the FIG. 18 for respective other parameters. Examples of the parameters for which the FIG. 18 tables are provided include, but are not limited to, the read voltage Vcgr and the voltage Vread as in the first embodiment. FIG. 19 illustrates an erasure and write temperature table according to the second embodiment. The temperature combination tables and the erasure and write temperature table are written in the memory device 100 before the memory system 1 turns off as in the first embodiment.

The temperature combination tables in FIG. 18 indicate adjustments ΔB (ΔB0, ΔB1, . . . ) which are based on respective different combinations of the read temperatures and write temperatures for respective erasure temperatures. Specifically, a particular temperature combination table indicates adjustments for a case where the corresponding memory device 100 was at a temperature TE0 upon the data erasure. Similarly, respective temperature combination tables for different plural erasure temperatures TE0 to TE8 are prepared. Erasure temperatures TE0 to TE8 are different, for example, by 10° C., and are 0, 10, 20, 30, 40, 50, 60, 70, and 80° C., respectively. Erasure temperatures and difference other than this example may also be used. The structure itself for each temperature combination table is the same as that of the temperature combination table for one parameter of the first embodiment. Sets of adjustments LB may, however, be the same as or different from each other for two temperature combination tables. One set of temperature combination tables may be used in common for plural memory devices 100.

As illustrated in FIG. 19, the erasure and write temperature table has entries for each of the blocks BLK. Each entry includes an erasure temperature as well as a write temperature the same as that in the first embodiment. The erasure temperature TE0, TE1, TE2, TE3, TE4, TE5, TE6, TE7, or TE8 for a particular block BLK is a measured temperature at the temperature sensor 17 upon erasure of that block BLK. The erasure temperature and write temperature stored in the erasure and write temperature table is a component in the same set of temperatures as discrete plural temperatures used in the temperature combination tables.

Figure 21:
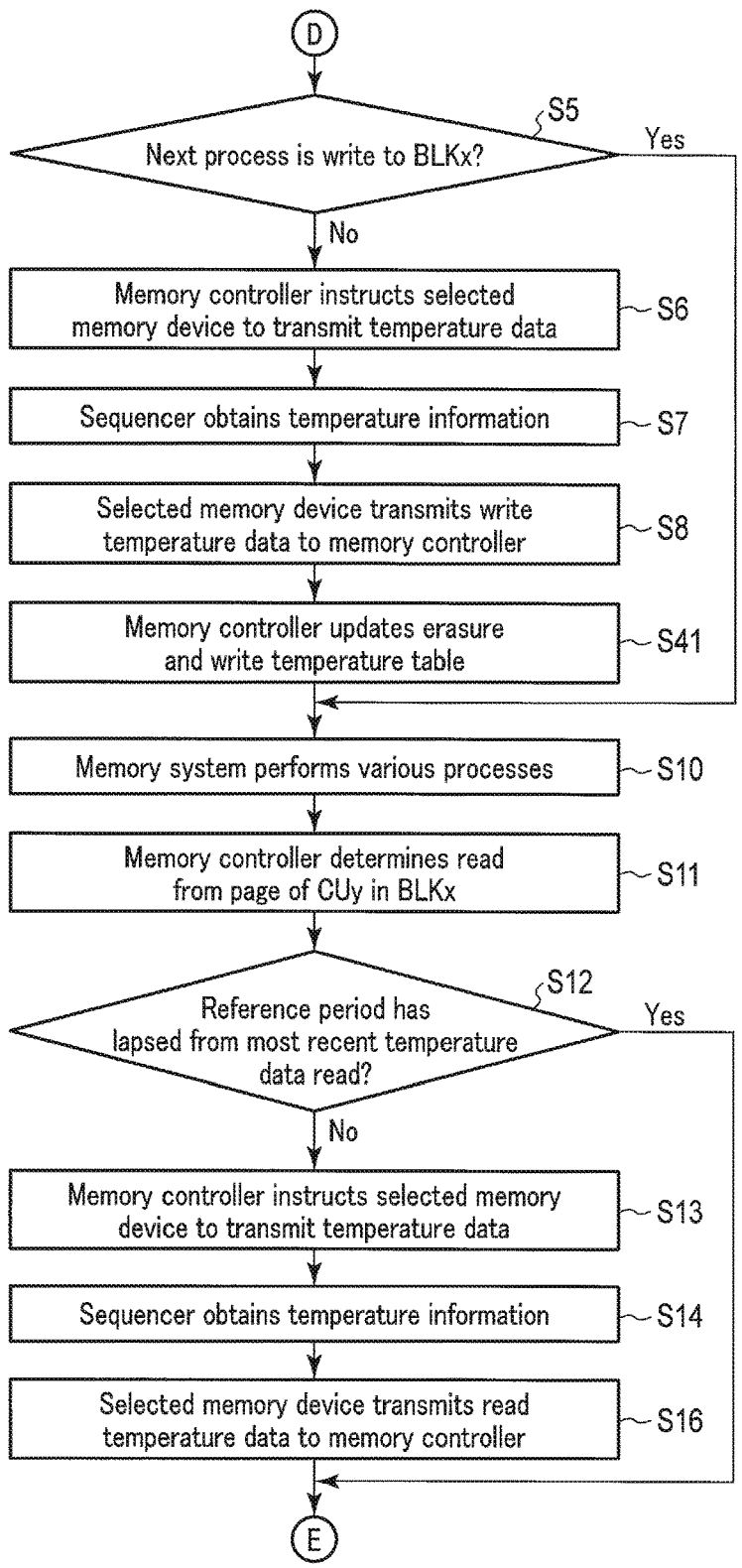
FIG. 21 illustrates another part of the flow of the operation of the memory system of the second embodiment.
Figure 22:
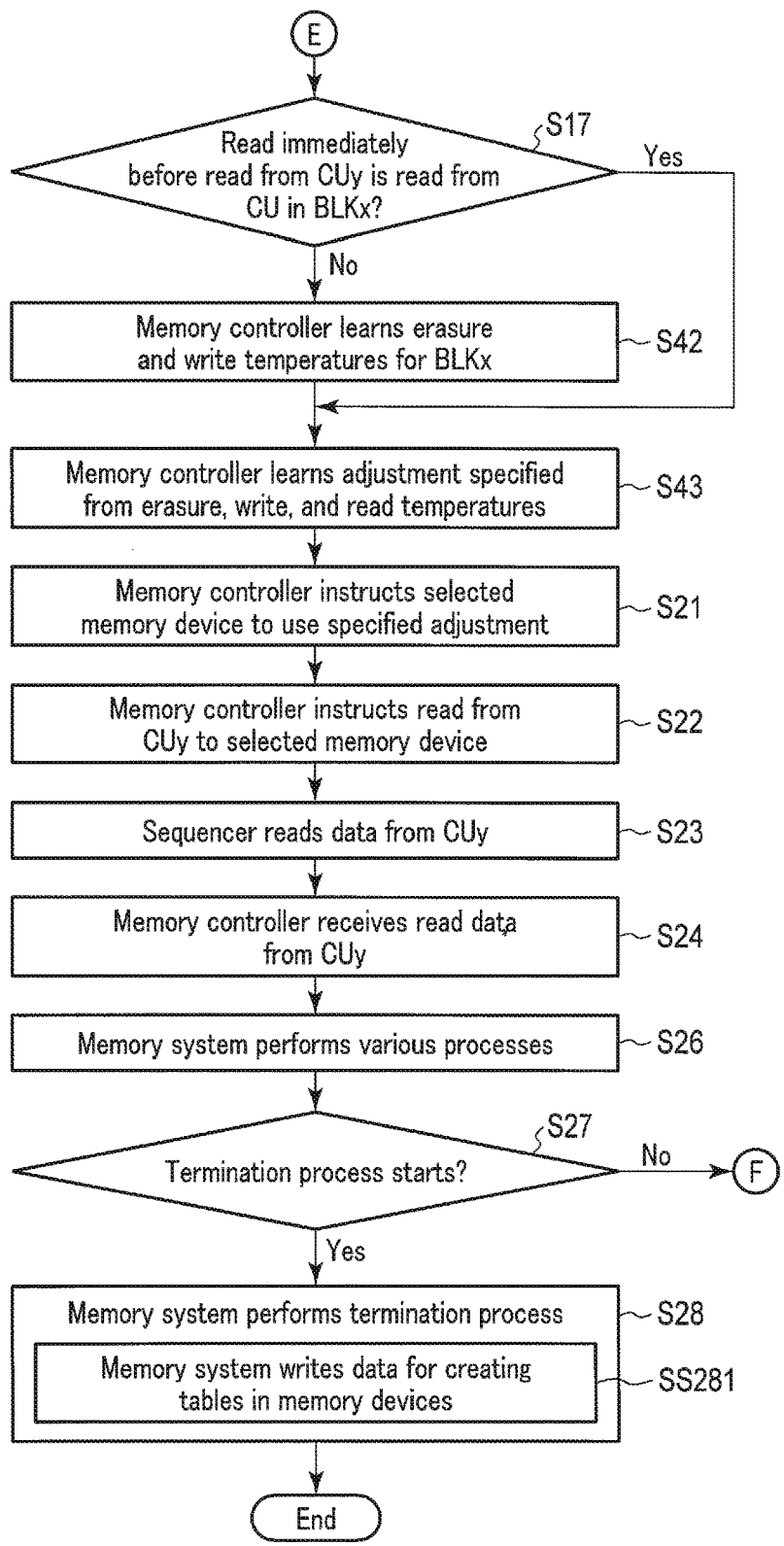
FIG. 22 illustrates still another part of the flow of the operation of the memory system of the second embodiment.

Referring to FIGS. 20 to 22, operations of the memory system 1 of the second embodiment will now be described. FIGS. 20 to 22 illustrate the flow of operation of the memory system 1 of the second embodiment. FIGS. 20 to 22 focus on processes relevant to a block BLKx in order to avoid an unnecessarily complicated flow as in the first embodiment (FIGS. 7 to 9).

The tables created in step S1 include the temperature combination tables, and the erasure and write temperature table.

In step S31, the overall controller 22 controls the memory interface 24 to instruct a selected memory device 100 to erase the data in the block BLKx. The erasure is based, for example on an instruction from the host device 2. Alternatively, the erasure is based on determination by the overall controller 22 without being based on an instruction from the host device 2. For example, the overall controller 22 determines to copy data in a particular block ELK in the memory device 100 to another block BLK and then erase the copied original data in order to move substantial data for the garbage collection or refresh regardless of an instruction from the host device 2. The erasure instruction includes an erasure command and an address signal specifying the erase-target block, for example.

When the selected memory device 100 receives the erasure command and the address signal, the sequencer 12 controls the potential generator 13, the driver 14, the row decoder 15, and the sense amplifier 16, to erase the data in the block BLKx (step S32).

With the erasure completed, the memory controller 200 instructs the selected memory device 100 to transmit temperature data (step S33). When instructed to transmit the temperature data, the sequencer 12 obtains the temperature information MND from the temperature sensor 17 (step S34). The sequencer 12 then transmits the data indicative of the temperature included in the obtained temperature information MND to the memory controller 200 (step S35). The transmitted temperature data is referred to as erasure temperature data including the erasure temperature upon the erasure for the block BLKx.

Upon reception of the erasure temperature data, the memory controller 200 updates the erasure and write temperature table (step S36). Specifically, the memory controller 200 stores the erasure temperature indicated in the erasure temperature data as the erasure temperature for the block BLKx in the erasure and write temperature table. The memory system 1 then performs various processes (step S37).

After step S37, the memory controller 200 performs the same processes as step S3, S4, S5, S6, S7, S8, S9, S11, S12, S13, S14, S15, S16, and S17 of the first embodiment (FIGS. 7 to 9) only with the difference of step S9 being replaced with step S41. In step S41, the memory controller 200 updates the erasure and write temperature table with the write temperature data obtained at step S8. Specifically, the memory controller 200 stores the erasure temperature indicated in the erasure temperature data as the erasure temperature for the block BLKx in the erasure and write temperature table.

In step S17, when the memory controller 200 determines that the process immediately before the read from the cell unit CUx is not a read from a cell unit CU in the block BLKx (No branch), the flow goes to step S42. In step S42, the memory controller 200 refers to the erasure and write temperature table, and obtains the erasure and write temperatures for the block BLKx. Step S42 continues at step S43.

In contrast, with a read from the block BLKx (Yes branch) of step S17), the flow goes to step S43 without passing through step S42. The set of steps S17 and S42 may also precede the set of steps S12 to S16.

In step S43, the memory controller 200 refers to a temperature combination table and obtains an adjustment LB specified from the read, erasure, and write temperatures for the Block BLKx. The temperature combination table used is one for the parameter which the memory controller 200 wishes to adjust. When plural parameters are adjusted, temperature combination tables for respective parameters are referred to, and adjustments ΔB for respective parameters are specified.

After step S43, the memory controller 200 performs the same processes as step S21, S22, S23, S24, S26, and S28 of the first embodiment (FIGS. 7 to 9) only with the difference of the No branch of step S27 continuing at step S2.

<2.3. Advantages>

As in the first embodiment, the memory controller 200 according to the second embodiment stores temperature combination tables for each parameter, and instructs the memory device 100 to use the sum of an adjustment (LB) specified from the combination of the write and read temperatures and the default value for the corresponding parameter. This can produce the same advantages as the first embodiment.

Furthermore, according to the second embodiment, the memory controller 200 stores temperature combination tables for respective different erasure temperatures for one parameter. The memory controller 200 specifies one adjustment from the combination of the erasure, write, and read temperatures for the block BLKx, and instructs the memory device 100 to use the sum of the adjustment and the default value of the corresponding parameter. This allows data to be read more optimized than the first embodiment for the temperature. As a result, the life of the memory system 1 of the second embodiment is longer than that in the first embodiment based on the same principle as described in the first embodiment, and the yield of the memory systems 1 of the second embodiment is higher than that in the first embodiment.

Third Embodiment

The third embodiment relates to optimization of writes.

<3.1. Configuration>

The memory system 1, the memory controller 200, and the memory device 100 of the third embodiment have the same components and connections as those of the first embodiment. In contrast, however, the memory controller 200 and the memory device 100 in the third embodiment are configured to perform the operations described in the following.

<3.2. Operation>

The memory controller 200 stores a table illustrated in FIG. 23 while the memory system 1 is ON. FIG. 23 illustrates a write temperature and parameter adjustment table created by the memory controller 200 of the third embodiment. As illustrated in FIG. 23, each row of the write temperature and parameter adjustment table indicates adjustments ΔC (ΔC10, ΔC11, . . . ) for one write temperature. The write temperature in each row has a particular difference from the temperature in the next row on the lower side. The write temperatures TW0 to TW8 are 0, 10, 20, 30, 40, 50, 60, 70, and 80° C., respectively, for example. Each column indicates information for one parameter used in writes. Examples of the parameters include, but are not limited to, an initial program voltage Vpgmi, a difference ΔVpgm, a voltage Vpass, the verification voltage Vvf, and a program voltage application time T. The initial program voltage Vpgmi is a voltage applied to the selected word line WL in the first one of the plural program loops in a write. The difference Δpgm is a difference between a voltage in the $p^{th}$ (p being a natural number) program loop and a voltage in the $p+1^{th}$ program loop of the plural voltages applied to the selected word line WL in the respective plural program loops in a write. The voltage Vpass is applied to word lines WL other than the selected word line WL, or unselected word lines WL, in a write. The program voltage application time T is a time for which the program voltage Vpgm is applied to the selected word line WL in each program loop.

Figure 25:
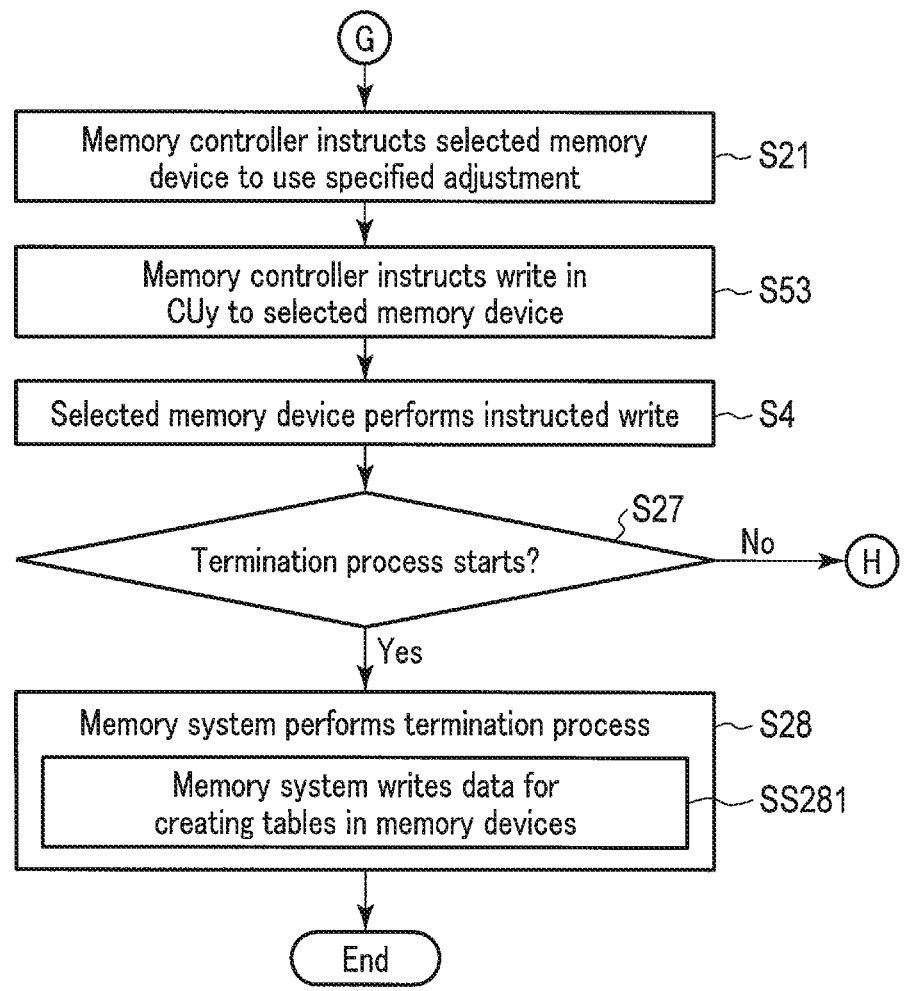
FIG. 25 illustrates another part of the flow of the operation of the memory system of the third embodiment.

Referring to FIGS. 24 and 25, operations of the memory system 1 of the third embodiment will now be described. FIGS. 24 and 25 illustrate the flow of operation of the memory system of the third embodiment. FIGS. 24 and 25 focus on processes relevant to a block BLKx in order to avoid an unnecessarily complicated flow as in FIGS. 7 to 9.

The tables created in step S1 include the write temperature and parameter adjustment table. Following step S2, the memory controller 200 determines to write data in a cell unit CUy in the block BLKx (step S51). The determination of write is based, for example, on a write instruction from the host device 2, or not based on an instruction from the host device 2 but on determination that the memory controller 200 will write the management data in the memory device 100.

The memory controller 200 then performs step S12. With a reference period having lapsed (Yes branch of step S12), the memory controller 200 performs steps S6, S7, and S8 in order to obtain the current temperature data. Step S8 continues at step S52. Without the reference period having lapsed (No branch of step S12), the flow also continues at step S52.

In step S52, the memory controller 200 refers to the write temperature and parameter adjustment table, and obtains one or more adjustments ΔC specified from the obtained write temperature. The memory controller 200 then instructs the memory device 100 to use the specified adjustment ΔC (step S21). In step S53, the memory controller 200 instructs the selected memory device 100 to perform a write. For the instruction, the write command, information indicating the address specifying a cell unit CUy, the information specifying a page, and write data are transmitted. Upon reception of the instruction, the selected memory device 100 performs the instructed process (step S4).

Following step S4, steps S27 and S28 are performed. The flow goes back to step S2 unless the termination process starts (No branch of step S27).

<3.3. Advantages>

According to the third embodiment, the memory controller 200 stores the write temperature and parameter adjustment table, obtains a write temperature, and instructs the memory device 100 to use the sum of an adjustment (ΔC) selected based on the obtained write temperature and the default value of the corresponding parameter. The temperature at a write influences the write performance of the memory device 100 as described in the first embodiment. Therefore, data can be written more optimized for the temperature. This can reduce the variation of temperature-based performance of the memory system 1 more than a memory system which uses a parameter of a value optimized at a particular fixed temperature. Moreover, writes are performed with voltages optimized based on the temperature in the writes, which can alleviate deterioration of the data reliability in cell units CU caused due to application of unsuitable voltages to the cell units CU and improve the life of the memory system 1.

Fourth Embodiment

The fourth embodiment relates to optimization of erasures.

<4.1. Configuration>

The memory system 1, the memory controller 200, and the memory device 100 of the fourth embodiment have the same components and connections as those of the first embodiment. In contrast, however, the memory controller 200 and the memory device 100 in the fourth embodiment are configured to perform the operations described in the following.

<4.2. Operation>

The memory controller 200 stores a table illustrated in FIG. 26 while the memory system 1 is ON. FIG. 26 illustrates an erasure temperature and parameter adjustment table created by the memory controller 200 of the fourth embodiment. As illustrated in FIG. 26, each row of the erasure temperature and parameter adjustment table indicates adjustments ΔD (ΔD10, ΔD11, . . . ) for one erasure temperature. The erasure temperature in each row has a particular difference from the temperature in the row on the lower side. The erasure temperatures TE0 to TE8 are 0, 10, 20, 30, 40, 50, 60, 70, and 80° C., respectively, for example. Each column indicates information for one parameter used in erasures. Examples of the parameters include, but are not limited to, an erasure verification voltage Vevf. The erasure verification voltage Vevf is applied to word lines WL in an erase-target block BLK in order to verify the completion of the erasure. Specifically, 0V is applied to all the word lines WL in the erasure-target block BLK, a voltage Vera (for example, 20V) is applied to the substrate (pillar PL) of the cell transistors MT to perform the erasure, and, after the erasure, the erasure verification voltage Vevf is applied in order to sense the states of the cell transistors MT.

Figure 27:
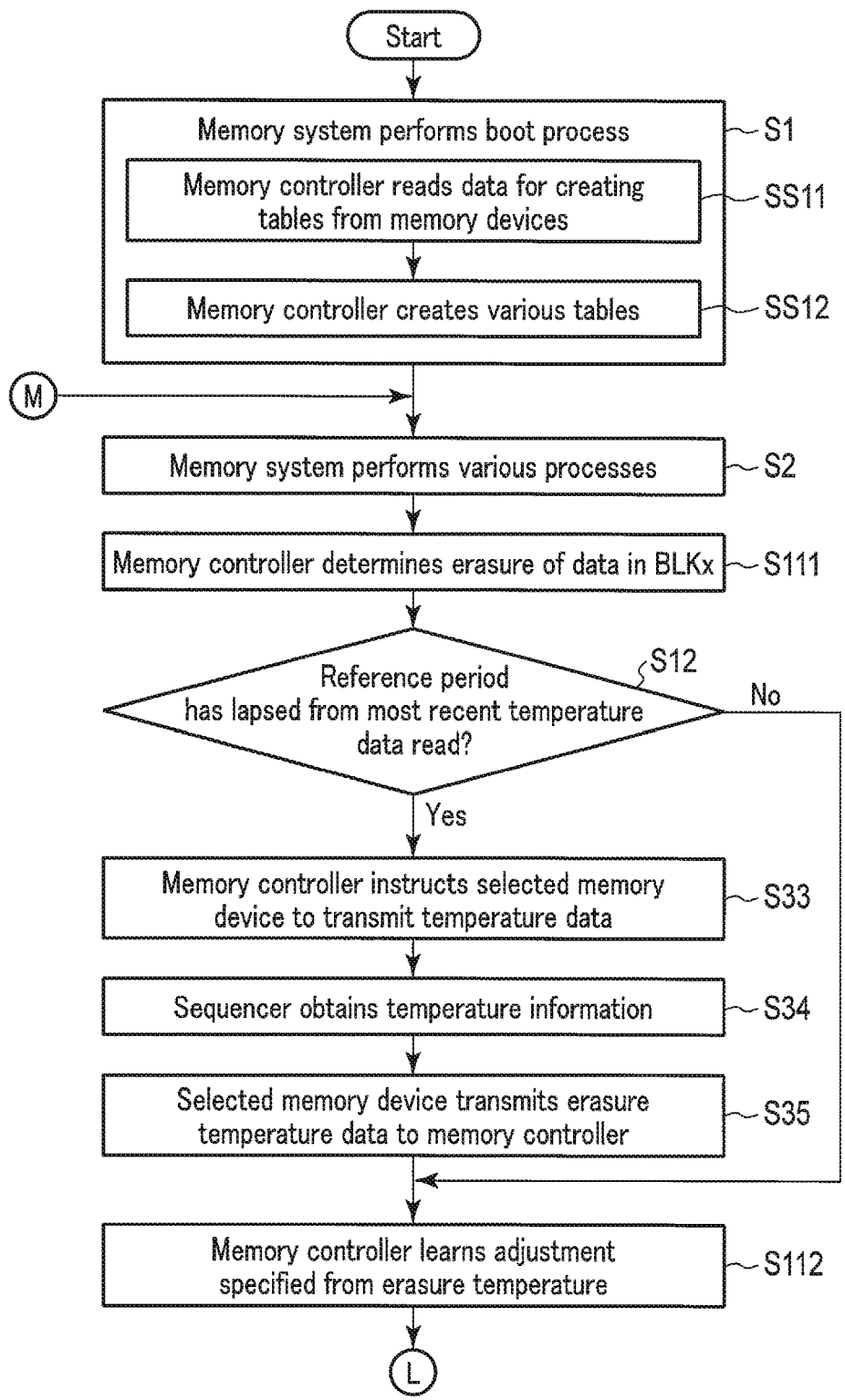
FIG. 27 illustrates a part of the flow of operation of a memory system of the fourth embodiment.
Figure 28:
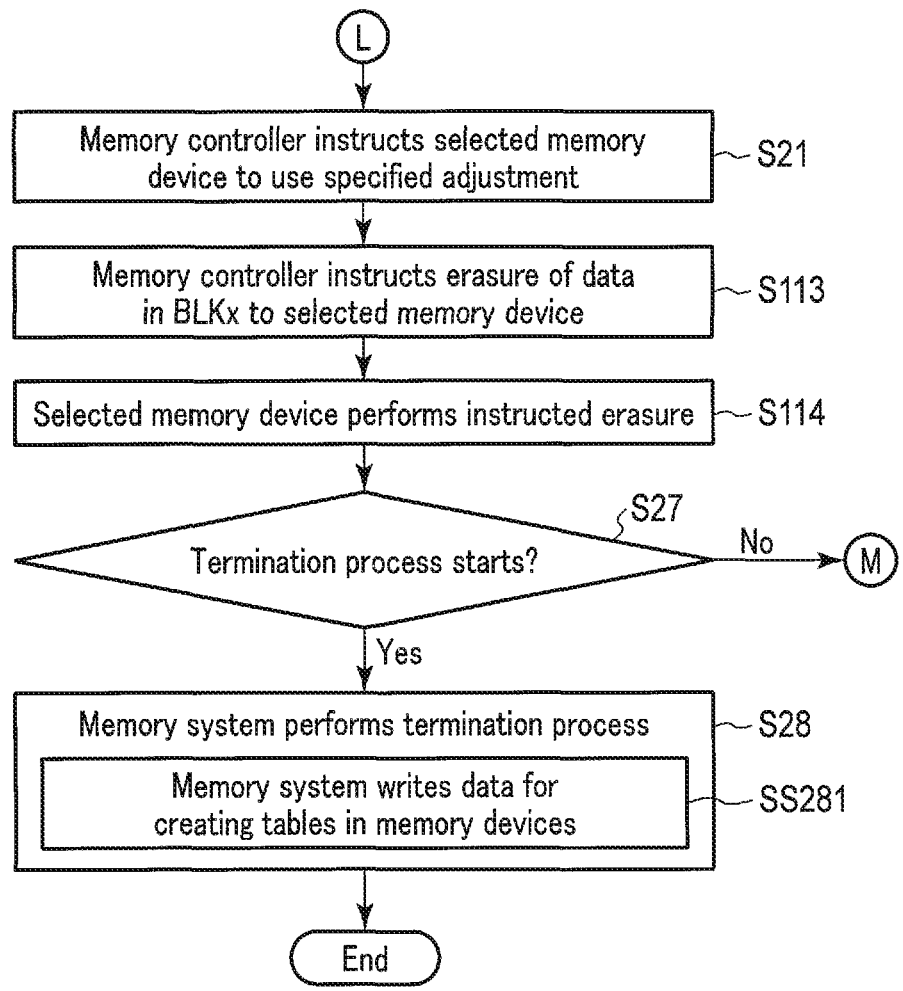
FIG. 28 illustrates another part of the flow of the operation of the memory system of the fourth embodiment.

Referring to FIGS. 27 and 28, operations of the memory system 1 of the fourth embodiment will now be described. FIGS. 27 and 28 illustrate the flow of operation of the memory system of the fourth embodiment. FIGS. 27 and 28 focus on processes relevant to a block BLKx in order to avoid an unnecessarily complicated flow as in FIGS. 7 to 9.

The tables created in step S1 include the erasure temperature and parameter adjustment table. Following step S2, the memory controller 200 determines to erase data in the block BLKx (step S111). The determination of erasure is based, for example on an erasure instruction from the host device 2.

The memory controller 200 then performs step S12. With the reference period having lapsed (Yes branch of step S12), the memory controller 200 performs steps S33, S34, and S35 in order to obtain the current temperature data. Step S35 continues at step S112. Without the reference period having lapsed (No branch of step S12), the flow also continues at step S112.

In step S112, the memory controller 200 refers to the erasure temperature and parameter adjustment table, and obtains an adjustment ΔD specified from the obtained erasure temperature. The memory controller 200 then instructs the memory device 100 to use the specified adjustment ΔD (step S21). In step S113, the memory controller 200 instructs the selected memory device 100 to perform an erasure. For the instruction, an erasure command and information indicating the address specifying the block BLKx are transmitted.

Upon reception of the instruction, the selected memory device 100 erases the data in the block BLKx (step S114). The erasure includes application of voltages for data erasure, and the erasure verification. In the erasure, the sequencer 12 uses the sum of the adjustment ΔD instructed to be applied, and the default value of the parameter for which that adjustment ΔD is provided for adjustment.

Following step S114, steps S27 and S28 are performed. The flow goes back to step S2 unless the termination process starts (No branch of step S27).

<4.3. Advantages>

According to the fourth embodiment, the memory controller 200 stores the erasure temperature and parameter adjustment table, obtains an erasure temperature, and instructs the memory device 100 to use the sum of an adjustment (ΔD) selected based on the obtained erasure temperature and the default value of the corresponding parameter. The temperature in an erasure influences the erasure performance of the memory device 100 as in a write and a read. In particular, the erasure verification is the same as the read even though it uses a voltage different from the read, and therefore the erasure verification is influenced by the temperature in the erasure verification. For this reason, data can be erased more optimized for the temperature with the erasure based on the erasure temperature. This can reduce the variation of temperature-based performance of the memory system 1 more than a memory system which uses a parameter of a value optimized at a particular fixed temperature.

Fifth Embodiment

In the fifth embodiment, operations by the memory controller of the first to third embodiments are performed by the host device 2.

<5.1. Configuration>

FIG. 29 illustrates functional blocks of an information processing system 4 of the fifth embodiment. As illustrated in FIG. 29, the information processing system 4 includes the host devices 2 and one or more memory systems 1. FIG. 29 illustrates an example of one memory system 1, and the following description is based on such an example.

The host device 2 in the fifth embodiment includes a CPU 41, a RAM 42, and a controller 43. The RAM 42 stores various programs (firmware) and various data while the information processing system 4 is ON with a power supplied. Examples of the programs stored include an operating system (OS), a file system, an application software layer, etc. The RAM 42 also includes memory device temperature information 231. The memory device temperature information 231 includes the temperature combination tables and the write temperature table as described above.

The CPU 41 performs various processes by executing the program on the RAM 42. The CPU 41 is coupled to the controller 43 via a bus conforming to a communications standard, such as PCIe. The CPU 41 communicates with and controls the controller 43 in accordance with the PCIe.

The controller 43 is also coupled to each memory system 1 via a bus conforming to a communications standard, such as ATA, SATA, and SAS. For a case where the interface to which the CPU 41 conforms is different from the interface to which the memory system 1 conforms to communicate with the outside, the controller 43 translates signals conforming to one of the two types of interface into signals conforming to the other of the two types of the interface.

The host device 2 may further include components for being coupled to a network.

The host device 2 can instruct the memory system 1 to write data in the memory system 1, read data from the memory system 1, or erase data in the memory system 1 as in the first embodiment. Such writing, reading, or erasing data may be part of compaction and/or refresh which the host device 2 has determined to execute. Furthermore, the host device 2 can transmit instructions other than data write, read, and erasure to the memory system 1. Such instructions include outputting signals indicating the state of the memory device 100, the garbage collection started and managed by the host device 2, data writes, reads, and erasures with specified various conditions, for example. Execution of the instructions to the memory system 1 of these processes is determined by the OS, the application software layer, and the file system.

The memory system 1 has the same components and connections as those in the first embodiment.

<5.2. Operation>

Figure 30:
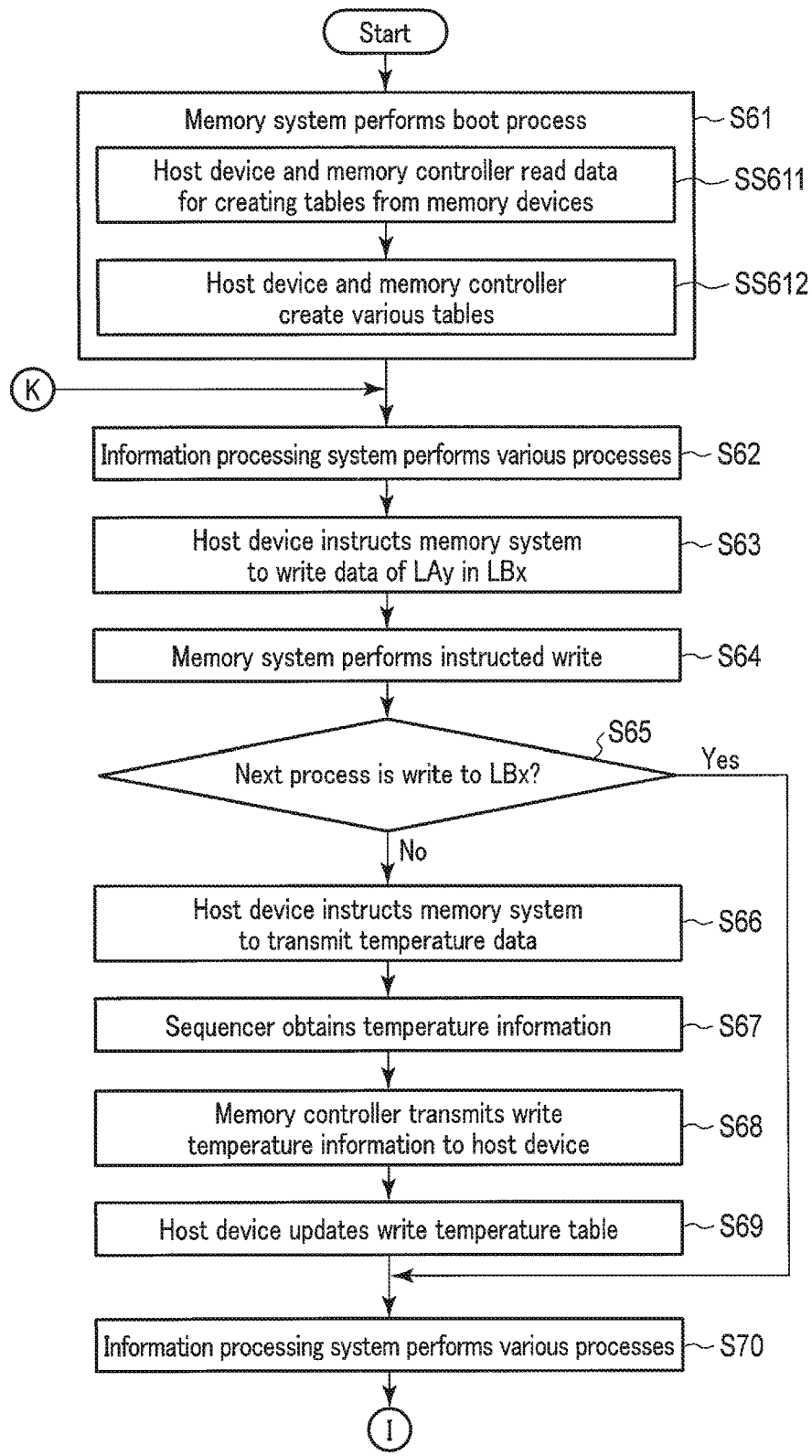
FIG. 30 illustrates a part of the flow of operation of the information processing system of the fifth embodiment.
Figure 31:
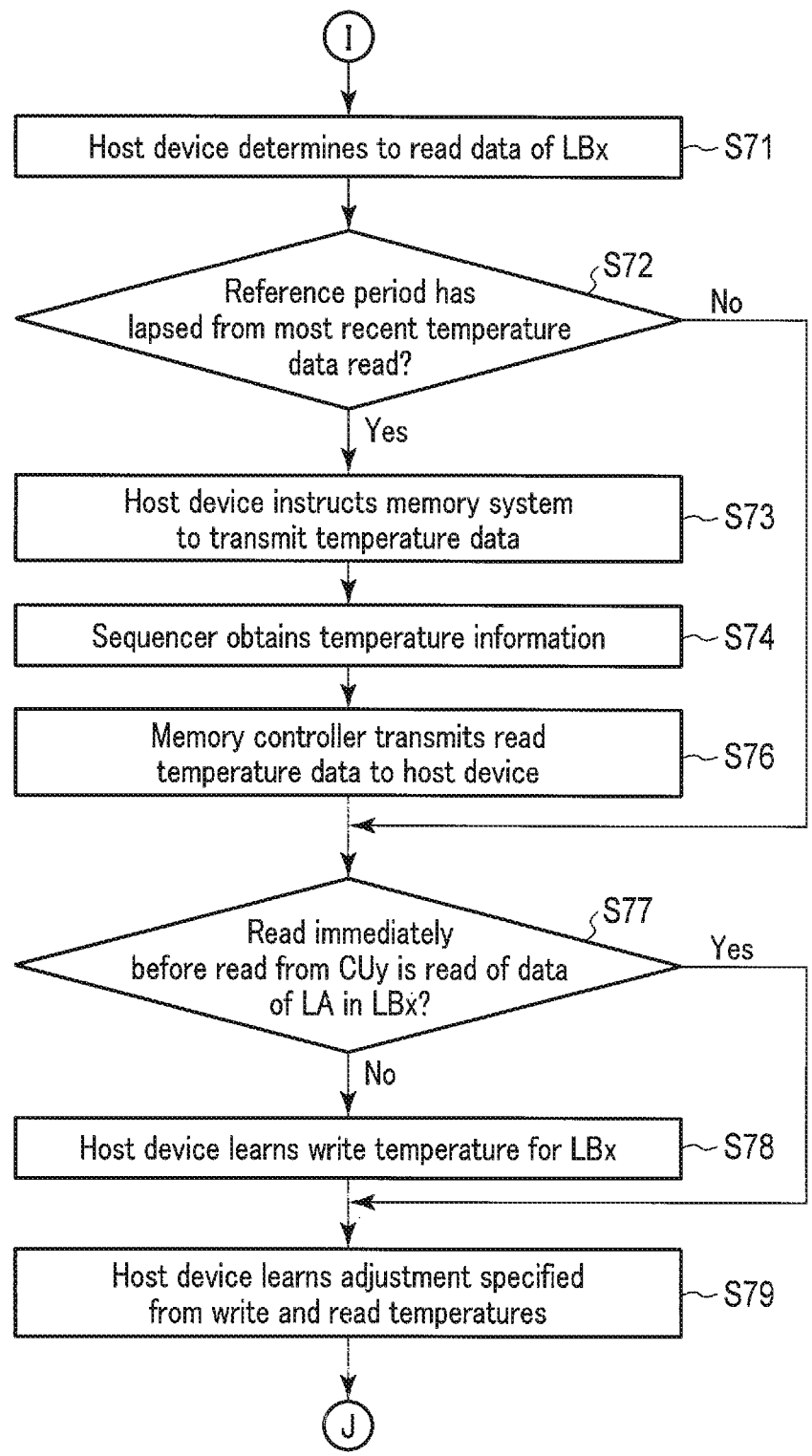
FIG. 31 illustrates another part of the flow of the operation of the information processing system of the fifth embodiment.
Figure 32:
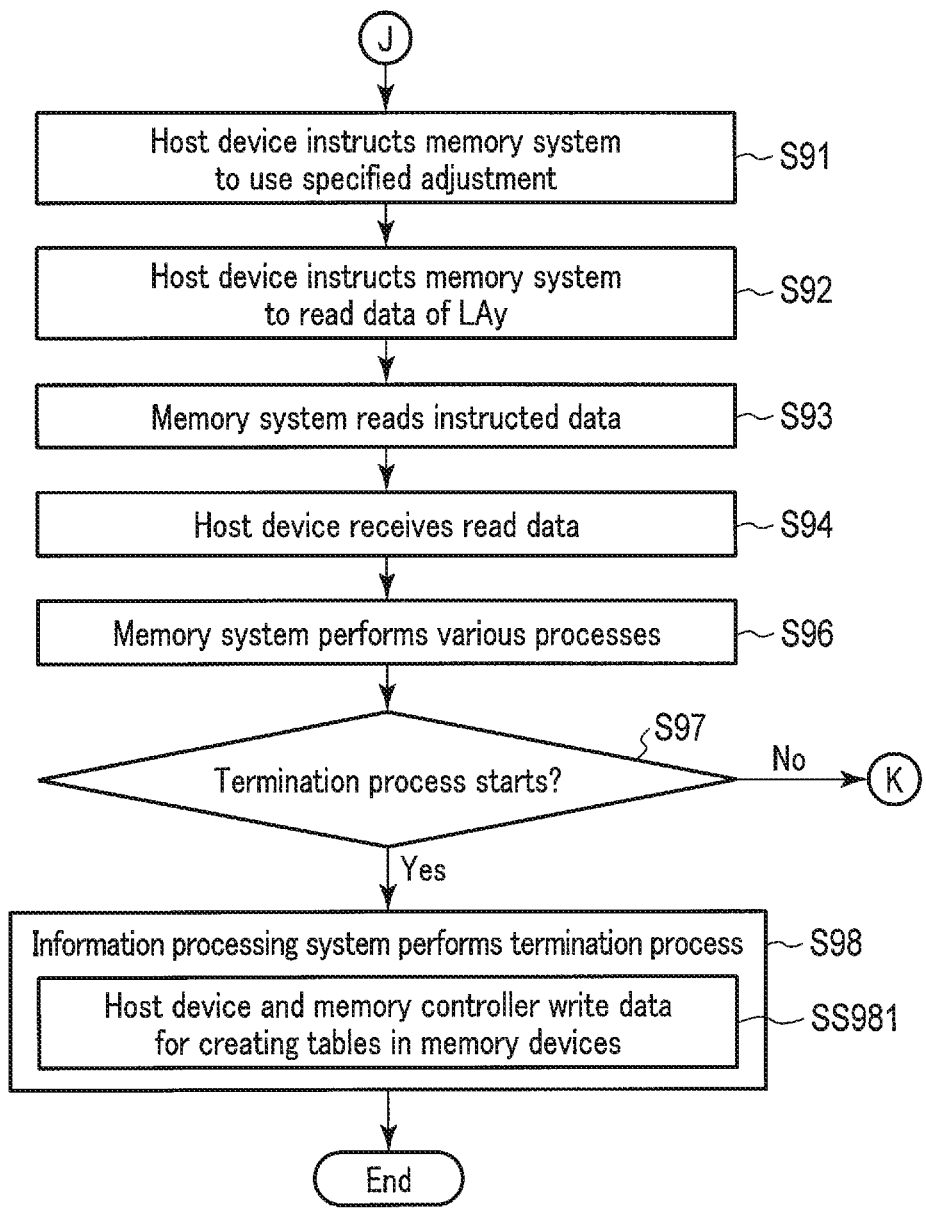
FIG. 32 illustrates still another part of the flow of the operation of the information processing system of the fifth embodiment.

FIGS. 30 to 32 illustrate the flow of operation of the information processing system 4 of the fifth embodiment, and an example of the fifth embodiment applied to the first embodiment. FIGS. 30 to 32 focus on processes relevant to a particular logical address group LBx in order to avoid an unnecessarily complicated flow. A logical address group LB is a set of one logical address or a particular number of successive logical addresses. The flow of FIGS. 30 to 32 is similar to the flow of FIGS. 7 to 9. Main differences include one that some steps performed by the memory controller 200 in the flow of FIGS. 7 to 9 are based on instructions by the host device 2.

When the information processing system 4 boots, it performs a boot process as illustrated in FIG. 30 (step S61). The boot process refers to a process required for the information processing system 4 to be ready to perform information processing with the data in the memory system 1. The boot process includes creating various management tables for operations in the information processing system 4 by the host device 2 (specifically, the program on the RAM 42), and the memory controller 200. Specifically, step S61 includes substeps SS611 and SS612. Substeps SS611 and SS612 are similar to substeps SS11 and SS12, respectively.

In substep SS611, the host device 2 specifies data for creating the temperature combination tables and the write temperature table, and instructs the memory system 1 to read the specified data. Upon reception of the instruction, the memory system 1 transmits the instructed data to the host device 2. Moreover, in substep S611, the memory controller 200 reads data for creating tables necessary for the memory controller 200 from each memory device 100.

In substep SS612, the host device 2 creates the temperature combination tables and the write temperature table from the received data, and the memory controller 200 creates tables from the received data. The temperature combination tables and the write temperature table are the same as those of the first embodiment although the write temperature table indicates information on the write temperature for every logical address group LB instead of the information on the write temperature for every block BLK in the first embodiment.

In step S62, the information processing system 4 performs various processes. The various processes include a data read and/or a write of data assigned with a logical address in a logical address groups LB other than the logical address group LBx, for example. In step S63, the host device 2 instructs the memory system 1 to write the data assigned with a logical address LAy in the logical address group LBx. In step S64, the memory system 1 performs the instructed write. In the write, the memory controller 200 determines a block BLK into which the data with the logical address LAy will be written, and reflects the association between the logical address LAy and the determined block BLK in the address mapping table.

In step S65, the host device 2 determines whether the process instructed following the instruction in step S63 is a write of data assigned with a logical address in the logical address group LBx. When the process following step S63 is not a write of data with a logical address in the logical address group LBx (No branch of step S65), the host device 2 instructs the memory system 1 to transmit temperature data (step S66). For instructing the transmission of the temperature data, the host device 2 transmits a temperature data read command to the memory system 1. When the memory controller 200 receives the temperature data read command from the host device 2, it instructs the selected memory device 100 for the write instructed in step S64 to read the temperature data. In step S67, the sequencer 12 performs the same operation as step S7, obtains the temperature data, and transmits the same to the memory controller 200 as the write temperature data. In step S68, the memory controller 200 transmits the write temperature data to the host device 2.

When the host device 2 receives the write temperature data, it updates the write temperature table in step S69. Step S69 continues at step S70.

With the process following step S63 being a write of data with a logical address in the logical address group LBx (Yes branch of step S65), the flow goes to step S70 without passing through steps S66, S67, S68, and S69.

In step S70, the information processing system 4 performs the various processes as in step S62. With step S70 reached from the Yes branch of step S65, the process in step S70 is a write of data assigned with a logical address in the logical address group LBx.

In step 71, the host device 2 determines to read data with a particular logical address LAy in the logical address group LBx based on a process and determination (step S71). In step S72, the host device 2 determines whether the reference period has lapsed from the most recent time when the temperature data was read. With the reference period having lapsed (Yes branch of step S72), the host device 2 transmits a temperature data read command to the memory system 1 (step S73).

In step S74, the sequencer 12 performs the same operation as step S14 to obtain the temperature data, and transmits the same as the read temperature data to the memory controller 200. In step S76, the memory controller 200 transmits the read temperature data to the host device 2.

Without the reference period having lapsed from the most recent time when the temperature data was read (No branch of step S72), the host device 2 determines to use the temperature data obtained most recently, and the flow goes to step S77.

In step S77, the host device 2 determines whether the process immediately before the read of data with the logical address LAy is a read of data with a logical address LA in the logical address group LBx. Without the read of data with a logical address LA in the logical address group LBx (No branch of step S77), the host device 2 refers to the write temperature table and obtains the write temperature of the logical address group LBx (step S78). Step S78 continues at to step S79. In contrast, with the read of data with a logical address LA in the logical address group LBx (Yes branch of step S77), the flow goes to step S79 without passing through step S78. In step S79, the host device 2 refers to the temperature combination table and obtains an adjustment ΔA specified from the read and write temperatures for the logical address group LBx.

In step S91, the host device 2 instructs the memory system 1 to use the sum of the specified adjustment 1A and the default value of the adjustment-target parameter. In step S92, the host device 2 instructs the memory system 1 to read the data with the logical address LAy in the logical address group LBx.

In step S93, the memory system 1 reads the instructed data. Specifically, the sequencer 12 refers to the address mapping table, specifies a cell unit CU and a page storing the read-target data in the memory device 100, reads data from the specified page, and transmits the read-target data to the host device 2. In the read, the sequencer 12 uses the sum of the adjustment ΔA instructed to be applied and the default value of the parameter for which that adjustment ΔA is prepared. In step S94, the host device 2 receives the read data. The information processing system 4 then performs various processes as in step S62 (step S96).

The flow goes back to step S62 unless a termination process for the information processing system 4 to turn off starts (No branch of step S97). The termination process refers to a process for the information processing system 4 to turn off, and starts by notification of start of stop of the power supply to the memory system 1 from the host device 2. When the termination process starts (Yes branch of step S97), the information processing system 4 performs the termination process (step S98). The termination process includes writing data to create the management tables including the temperature combination tables and the write temperature table in the corresponding memory device 100 (substep SS981). The data to create the temperature combination tables and the latest write temperature table may be periodically written in each memory device 100 before the termination process starts and while the memory system 1 is receiving the power supply from the host device 2. The temperature combination tables can be included in the firmware as in the modification of the first embodiment. In this case, the write of the temperature combination tables in the memory device 1 every time the information processing system 4 turns off is unnecessary.

The case of the fifth embodiment being applied to the second embodiment is similar to the flow of FIGS. 20 to 22 of the second embodiment, and the above descriptions for the flow of FIGS. 30 to 32 apply as the differences. Main differences are that some steps performed by the memory controller 200 in the flow of FIGS. 20 to 22 are based on instructions of the host device 2. The erasure and write temperature table illustrated in FIG. 19 is stored by the host device 2. Moreover, an erasure of data assigned with a logical address group LBx is determined by the host device 2 in accordance with a process of the user of the information processing system 4, and the host device 2 instructs the memory system 1 to erase data. The memory system 1 performs the instructed erasure while updating the management data, such as the address mapping table. Moreover, the host device 2 instructs the memory system 1 to transmit the temperature data. Upon reception of the instruction, the memory controller 200 instructs the selected memory device 100 to transmit the temperature data, receives the erasure temperature data from the selected memory device 100, and transmits the erasure temperature data to the host device 2. The host device 2 updates the temperature combination table.

During a read, the host device 2 instructs the selected memory system 1 to transmit the read temperature data. Upon reception of the instruction, the memory controller 200 instructs the selected memory device 100 to transmit the temperature data, receives the temperature data from the selected memory device 100, and transmits the temperature data to the host device 2. The host device 2 then refers to the temperature combination table and obtains the corresponding adjustment ΔB from the read temperature and the erasure and write temperatures for the read data. The host device 2 then instructs memory system 1 to use the adjustment ΔB to read the data with the logical address LAy in the corresponding logical address group LB.

The case of the fifth embodiment being applied to the third embodiment is similar to the flow of FIGS. 24 to 25 of the fifth embodiment, and the above descriptions for the flow of FIGS. 30 to 32 apply as the differences. Main differences are that some steps performed by the memory controller 200 in the flow of FIGS. 24 to 25 are based on instructions of the host device 2. The write temperature and parameter adjustment table illustrated in FIG. 23 is stored by the host device 2. When the host device determines to perform a write to the logical address LAy in a particular logical address group LB, it instructs the memory system 1 to transmit the write temperature data. Upon reception of the instruction, the memory controller 200 instructs the selected memory device 100 to transmit the temperature data, receives the temperature data from the selected memory device 100, and transmits the temperature data to the host device 2 as the write temperature data. The host device 2 then refers to the write temperature and parameter adjustment table and obtains the corresponding adjustment ΔC from the write temperature data. The host device 2 then instructs the memory system 1 to write the data using the adjustment ΔC.

<5.3. Advantages>

According to the fifth embodiment, data reads and/or writes optimized more for the temperature are performed by the host device 2 as in the first to third embodiments. Even when the data reads and/or writes optimized for the temperature are performed at the initiative of the host device 2, the same advantages as the first to third embodiments can be obtained.

Sixth Embodiment

The sixth embodiment is applied to the third embodiment and relates to adjustment of verification voltages in writes.

<6.1. Configuration>

The memory system 1, the memory controller 200, and the memory device 100 of the sixth embodiment have the same components and connections as those of the first embodiment. In contrast, however, the memory controller 200 and the memory device 100 in the sixth embodiment are configured to perform the operations described in the following. In the sixth embodiment, the verification voltages, etc. are adjusted based on the position of selected word lines WL.

<6.2. Operation>

FIG. 33 illustrates some of the voltages applied to a selected word line WL during a write to the selected memory device 100 of the sixth embodiment over time. As illustrated in FIG. 33, a write includes plural program loops. Each program loop includes a program and other stages (a stage of verification, a stage of calculation of write-uncompleted cell transistor MT, for example). In each program, a voltage is applied to the selected word line WL. A voltage applied to the selected word line WL in the program in a $p^{th}$ program loop is higher than a voltage applied to the selected word line WL in the program in a $p-1^{th}$ program loop by a difference ΔVpgmL. The difference ΔVpgmL is higher than the default difference ΔVpgm. The default difference ΔVpgm has a value used in the initial state, or a state where the value is not changed, of the memory device 100.

Use of the difference ΔVpgmL is instructed by the memory controller 200, and is instructed by an adjustment command preceding a write instruction, for example. Alternatively, the adjustment command may specify the value of the difference ΔVpgm or a difference between the difference ΔVpgm and the difference ΔVpgmL. For example, the memory controller 200 instructs use of the difference ΔVpgmL in most writes to the memory devices 100. For example, the memory controller 200 may instruct the use of difference ΔVpgmL in all writes to the memory devices 100. The following description is based on an example of use of the difference ΔVpgmL in all writes.

Figure 34:
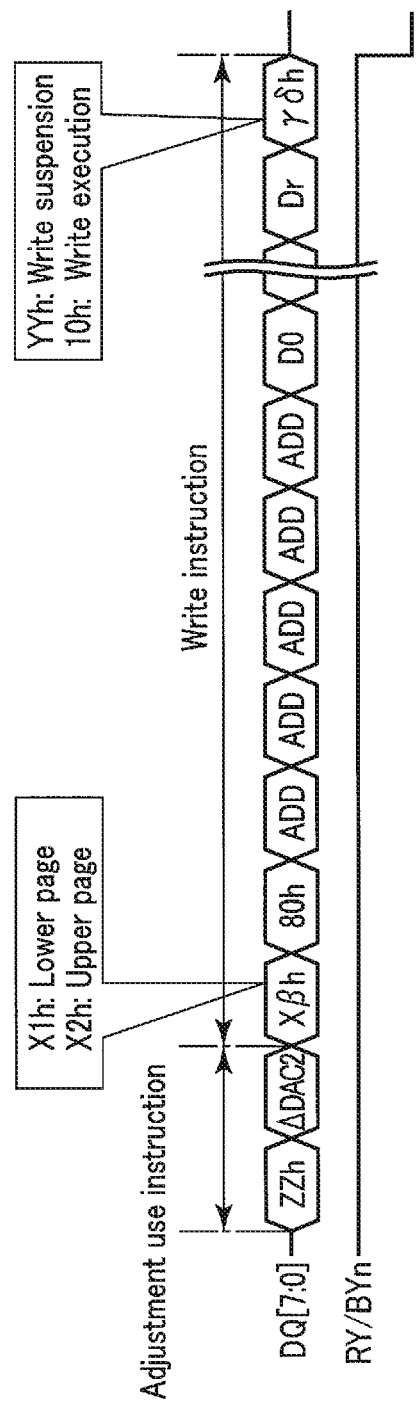
FIG. 34 illustrates signals DQ according to the sixth embodiment transmitted for a write.

FIG. 34 illustrates signals transmitted to a selected memory device 100 from the memory controller 200 for a write in the sixth embodiment over time. As illustrated in FIG. 34, the memory controller 200 transmits an adjustment use instruction. The adjustment use instruction includes a command ZZh and a signal indicating an adjustment ΔDAC2. The command ZZh instructs use of a value different from the default value for a verification voltage in the write instructed by the subsequent write instruction. The value of the verification voltage instructed with the command ZZh is described below. The adjustment ΔDAC2 indicates an adjustment (an adjustment ΔVvf to be described) to be added to a default value.

Following the signal indicating the adjustment ΔDAC2, the memory controller 200 transmits a write instruction. The write instruction includes a command Xβh (β being one or two), a command 80h, an address signal ADD, write data D0 to Dr (r being a natural number), and a command γδh (γδ being YY or 10). The command Xβh specifies a write-target page and varies based on the write-target page. For example, in order to indicate a write to a lower page and an upper page, the commands X1h and X2h are transmitted, respectively. For a case of storing one bit in one cell transistor MT, the command xβh is not transmitted.

The command γδh instructs suspension or execution of the write. Two-page data are written together in a write-target cell unit CU, and therefore, with the two-page data not yet transmitted to the selected memory device 100, the command YYh is transmitted in the position of the command γδh in order to instruct the suspension of the write. In contrast, with the two-page data already transmitted to the memory device 100, the command 10h is transmitted in the position of the command γδh in order to instruct the execution of the write.

Figure 36:
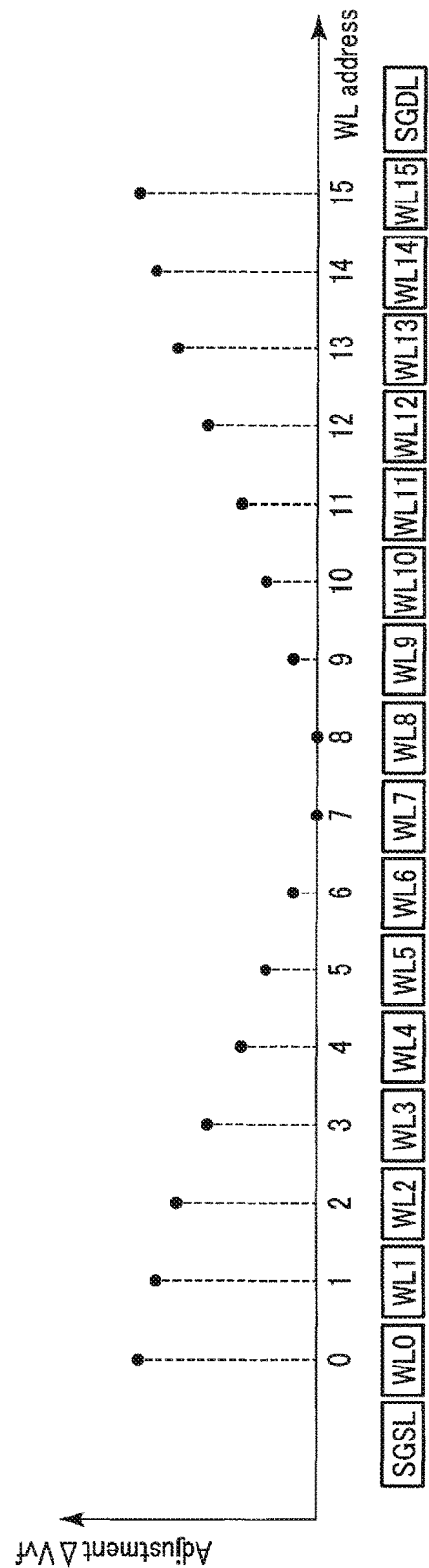
FIG. 36 illustrates correspondence between word line addresses and adjustments in the sixth embodiment.

Referring to FIGS. 35 and 36, the write following the adjustment use instruction will now be described. FIG. 35 illustrates the write by a write instruction which follows an adjustment use instruction in the sixth embodiment, and illustrates voltages applied to a selected word line WL in such a write over time. As illustrated in FIG. 35, each program loop includes the program stage, and the following verification stage and the calculation stage described above.

A verification stage includes the verification for one or more of the A, B, and C-levels according to the program loop number for which the verification is performed. For example, while the program loop number is small, no cell transistors MT have their threshold voltages raised to the C-level, and therefore the verifications for the A and B-levels are performed. In contrast, while the program loop number is large, cell transistors MT to be written in the A-level has already passed the verification, and therefore the verification for the A-level is not performed.

Verification voltages AVS, BVS, and CVS are applied to the selected word line WL during the verification for the A, B, and C-levels, respectively. The verification voltages AVS, BVS, and CVS are smaller than the default verification voltages AV, BV, and CV, respectively. Each of the differences between the verification voltages AVS and AV, between the verification voltages BVS and BV, and between the verification voltages CVS and CV is equal to an adjustment ΔVvf. The adjustment command ZZh instructs the use of the value equal to the default value of the verification voltage Vvf minus the adjustment ΔVvf for the verification.

The differences between the verification voltages AVS and AV, between the verification voltages BVS and BV, and between the verification voltages CVS and CV may also be different from each other. The following example is based on an example where the same difference ΔVvf is used for different levels.

The adjustment ΔVvf varies depending on the physical position of a selected word line WL. Specifically, the differences ΔVvf of different values are used for different selected word lines WL. FIG. 36 illustrates the addresses of respective word lines WL and corresponding adjustments ΔVvf in the sixth embodiment. FIG. 36 illustrates an example of one string STR including sixteen word lines WL. Hereinafter, names "adjustments ΔVvf0 to ΔVvf15" respectively corresponding to the word lines WL0 to WL15 are used. The word line WL0 is located at a first end among the word lines WL0 to WL15, and is nearest to the select gate line SGSL. The word line WL15 is located at a second end among the word lines WL0 to WL15, and is nearest to a select gate line SGDL. The word line WLε+1 (ε being a natural number of one to fourteen) is located above, with respect to the z-axis, the word line WLε, or further from the well pw. One or more center word lines are those, among the word lines WL0 to WL15, located between the first end (or, the word line WL0) and the second end (or, the word line WL15) and located where the difference of the distance from the first end and the distance from the second end is the smallest. In the embodiment, each of the word lines WL7 and WL8 is located at the center. However, the term "center" and variants thereof are used for mere convenience for the description herein, and the distance between a central word line WL and the first end (word line WL0) does not need to be equal to the distance between the central word line WL and the second end (word line WL15).

As illustrated in FIG. 36, adjustments ΔVvf0 and ΔVvf15 for the respective word lines WL0 and WL15 (at both ends) are the maximum among the adjustments ΔVvf0 to ΔVvf15. In contrast, the adjustments ΔVvf7 and ΔVvf8 for the respective central word lines WL7 and WL8 are the minimum among the adjustments ΔVvf0 to ΔVvf15, and, for example, are zero. The adjustments ΔVvf0, ΔVvf1, ΔVvf2, ΔVvf3, ΔVvf4, ΔVvf5, ΔVvf6, and ΔVvf7 have values decreasing in this order. Similarly, the adjustments ΔVvf15, ΔVvf14, ΔVvf13, ΔVvf12, ΔVvf11, ΔVvf10, ΔVvf9, and ΔVvf8 have values decreasing in this order.

The same holds true for a case of one string STR including more or less word lines WL. Specifically, the adjustments ΔVvf for the word lines WL at both ends have the maximum values, the adjustments ΔVvf for one or more central word lines WL have the minimum values, and an adjustment ΔVvf for word line WL nearer to the end is larger. The same tendency also applies to a case where the set of adjustments ΔVvf for the verification voltage AV, the set of adjustments ΔVvf for the verification voltage BV, and the set of adjustments ΔVvf for the verification voltage CV are different from each other. Specifically, in each set of the adjustments ΔVvf, a word line WL nearer to the end has a larger adjustment ΔVvf, and adjustments ΔVvf for the same word line WLy in different sets have the same value or different values.

FIG. 37 illustrates the flow of operation of the memory system 1 of the sixth embodiment. In step S101, the memory controller 200 instructs the selected memory device 100 to use the difference ΔVpgmL. In step S102, the memory controller 200 instructs the selected memory device 100 to perform a write with an adjustment ΔVvf. In step S103, the selected memory device 100 performs a program with the difference ΔVpgmL, and a verification with the adjustment ΔVvf.

The sixth embodiment may be combined with the fifth embodiment. Specifically, use of the difference ΔVpgmL and use of a verification voltage Vvf with an adjustment ΔVvf added are determined by the host device 2. The host device 2 then instructs the determined write to the memory system 1. The memory controller 200 performs the instructed write to the memory device 100.

<6.3. Advantages>

According to the sixth embodiment, both of accelerated writes in the memory system 1 and reduced read errors through write optimization can be realized. Details are as follows.

The shapes (or, widths) of the distribution of the threshold voltages of the written-in cell transistors MT for each level are desired to be narrow. This is because the narrower the distribution, the less the overlapping of adjacent distributions and erroneous reads. In order for the distribution width to be reduced, a difference ΔVpgm of a smaller magnitude is desirable because one application of the program voltage Vpgm with a large difference ΔVpgm raises the threshold voltages greatly. For example, a cell transistor MT with a threshold voltage which will exceed a verification voltage Vvf after one more application of the program voltage Vpgm will have too large a threshold voltage by application of the program voltage Vpgm with a difference ΔVpgm of a large magnitude added. On the other hand, the smaller the magnitude of the difference ΔVpgm, the longer a time for a write. With such a trade-off considered, the default magnitude of the difference ΔVpgm is determined.

The use of the difference ΔVpgm of the default magnitude may, however, be unable to satisfy the performance required for the memory system 1. Specifically, the memory device 100 indeed keeps being improved in its performance; however, the memory system 1 is required to have a very high performance, which may not be satisfied only through an improved performance of the memory device 100. In order to address this challenge, the speed of the operation of the memory system 1 may be increased through improved control of the memory device 100 by the memory controller 200. Specifically, the memory controller 200 instructs the memory devices 100 to use the difference ΔVpgmL to increase the speed of writes in the memory devices 100 as described with reference to FIG. 33. This can improve the write speed in the memory system 1.

On the other hand, the larger the magnitude of the difference ΔVpgm, the wider the distributions after a write, which results in increased read errors. How wide a distribution becomes depends on the positions of the word lines WL. Specifically, the more other cell transistors MT there are around a read-target cell transistor MT, the more the write-target cell transistor MT is influenced to become difficult to be written in. For this reason, the cell transistors MT coupled to the word line WL located nearer to an end of a string STR are easier to be written in, and in particular cell transistors MT coupled to the word line WL at an end are easy to be written in.

Figure 38:
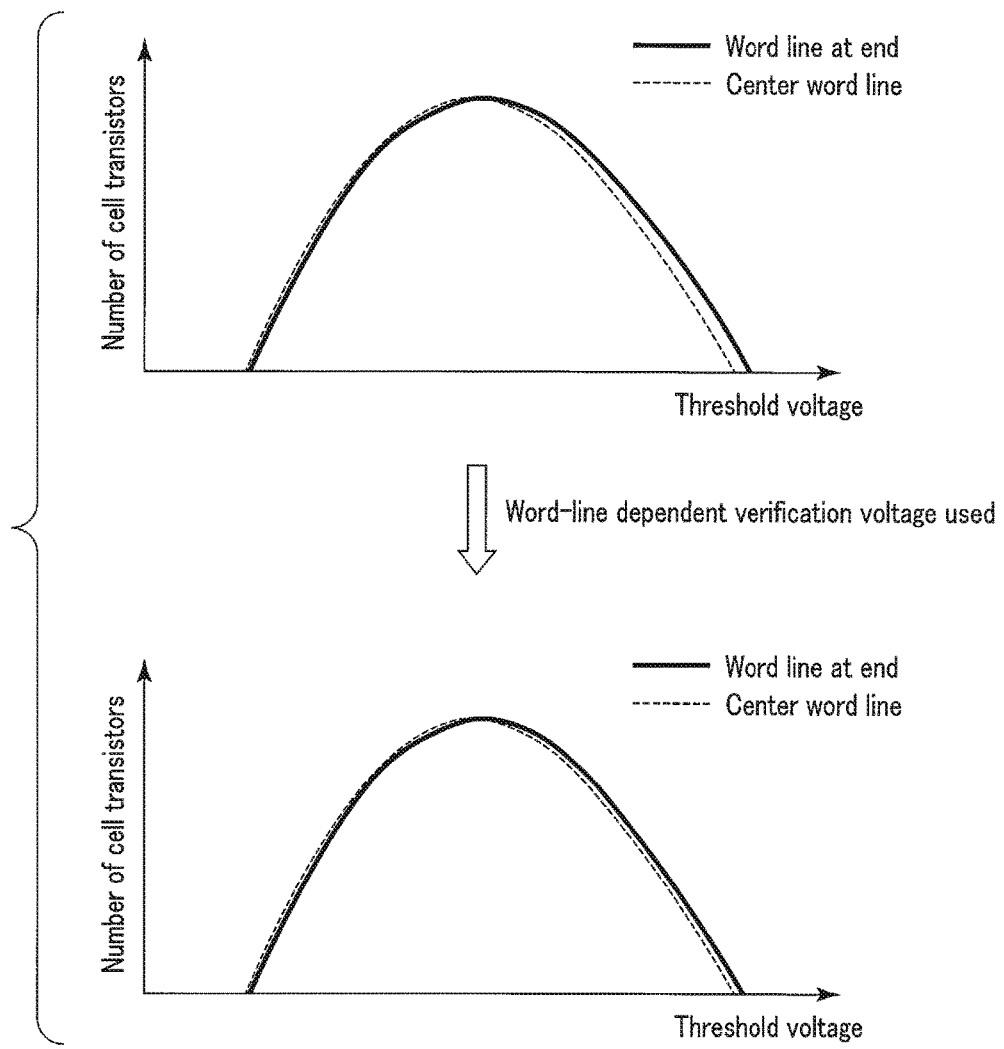
FIG. 38 illustrates threshold voltage distributions in the sixth embodiment with threshold voltage distributions for reference.

Due to the difference in easiness to be written in, writes to all cell transistors MT with a common verification voltage Vvf may cause an easier-to-be-written-in cell transistor MT to have a larger threshold voltage than that of a cell transistor MT difficult to be written in even if they are written in the same level. This is illustrated in the upper part of FIG. 38. The upper section of FIG. 38 illustrates one distribution of threshold voltages, and a case for cell transistors MT coupled to a word line WL at an end with a solid line and that for cell transistors MT coupled to a center word line WL with a dashed line. As illustrated in the upper section of FIG. 38, a larger threshold voltage for the word line WL at an end (or, threshold voltage nearer to the end of the distribution in the right-hand side) has a larger threshold voltage than that of the center word line WL. This results in a wider average shape of the distribution, and by extension increased read errors. Therefore, even use of an estimated better read voltage Vcgr does not sufficiently improve the read errors because the estimation of a better read voltage Vcgr depends on the average shape of the distribution.

According to the sixth embodiment, the verification voltage Vvf applied to word lines WL nearer to an end in the strings STR has a larger magnitude. For this reason, a larger threshold voltage for the word line WL at an end (for example, a threshold voltage nearer to the end of the distribution in the right-hand side) has a magnitude nearer to a magnitude for other word lines WL. Also for word lines WL other than that at an end, large threshold voltages are near to those for a center word line WL. This narrows the average shape of the distribution and decreases the read errors. In addition, this is compatible with the improvement in the speed of writes in the memory system 1 through the use of the difference ΔVpgmL. The reduced read errors extend the life and raise yield of the memory systems 1 due to the same principle as that described in the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
   a memory device including a first cell transistor; and
   a controller configured to:
     store information on a first temperature associated with a temperature of the memory device upon a write of data into the first cell transistor,
     obtain a second temperature of the memory device,
     determine an adjustment based on a combination of the first temperature and the second temperature, and
     instruct the memory device to use a first parameter to read data from the first cell transistor, the first parameter being based on the determined adjustment.

2. The system according to claim 1, wherein:
   the adjustment is selected from m×n adjustments (m and n being natural numbers) respectively for the m×n combinations of m different write temperatures and n different read temperatures, and
   the controller is configured to:
     select one of the m write temperatures based on the first temperature, select one of the n read temperatures based on the second temperature, and
determine the adjustment specified by the combination of the selected write temperature and the selected read temperature.

3. The system according to claim 1, wherein:
the controller is configured to determine the adjustment on the basis of:
the first temperature; and
a relationship between the first temperature and an adjustment for the second temperature.

4. The system according to claim 1, wherein:
the controller is configured to:
transmit a first command to the memory device to obtain the information on the first temperature from the memory device, and
transmit a second command to the memory device to obtain the information on the second temperature from the memory device.

5. The system according to claim 4, wherein:
the controller is configured to transmit the second command after a reference time lapses from a time when the information on the second temperature has been last obtained.

6. The system according to claim 1, wherein:
the memory device is configured to use a sum of an initial value and the adjustment for the first parameter upon reception of the instruction from the controller.

7. The system according to claim 1, wherein:
the memory device includes a first block including the first cell transistor,
the first temperature is a temperature of the memory device upon a write of data into the first block, and
the second temperature is a temperature of the memory device upon a read of data from the first block.

8. The system according to claim 7, wherein:
the memory device includes blocks including respective cell transistors, and
the controller is configured to store information associated with respective temperatures upon respective writes to respective cell transistors of the blocks.

9. The system according to claim 1, wherein:
the first parameter is related to a voltage applied to a first word line coupled to the first cell transistor in a read of data from the first cell transistor.

10. The system according to claim 1, wherein:
the first parameter is related to a voltage applied to a first word line different from a second word line coupled to the first cell transistor in a read of data from the first cell transistor.

11. The system according to claim 1, wherein:
the adjustment is based on a combination of the first temperature, the second temperature, and a third temperature associated with a temperature of the memory device upon an erasure of data in the first cell transistor.

12. A memory system comprising:
a memory device including a first cell transistor; and
a controller configured to:
obtain a first temperature of the memory device, and
instruct the memory device to use a value based on the first temperature for a first parameter to write data into the first cell transistor or erase data in the first cell transistor.

13. The system according to claim 12, wherein:
the controller is configured to transmit a first command to the memory device to obtain information on the first temperature from the memory device.

14. The system according to claim 13, wherein:
the controller is configured to transmit the first command after a reference time lapses from a time when the information on the first temperature has been last obtained.

15. The system according to claim 12, wherein:
the first parameter includes at least one of:
a first voltage first applied to a first word line coupled to the first cell transistor among voltages increasing stepwise in a write of data into the first cell transistor,
a difference between successive two of the voltages,
a second voltage applied to a second word line different from the first word line in the write,
a third voltage being lower than the first voltage and repeatedly applied to the first word line in the write, and
a time for which one of the voltages is applied in the write.

16. The system according to claim 12, wherein:
the first parameter includes a first voltage applied to a word line coupled to the first cell transistor after a second voltage is applied to a semiconductor substrate of the first cell transistor in an erasure of data in the first cell transistor.

17. A memory system comprising:
a memory device including:
a first cell transistor,
a first word line coupled to the first cell transistor,
a second cell transistor, and
a second word line coupled to the second cell transistor; and
a controller configured to:
transmit a first instruction, the first instruction including first data and a first signal indicative of a first value and specifying the first cell transistor to the memory device,
transmit a second instruction, the second instruction including the first data and a second signal indicative of a second value and specifying the second cell transistor to the memory device, wherein
the memory device is configured to:
repeatedly apply a first voltage to the first word line in a write of data into the first cell transistor upon reception of the first instruction, and
repeatedly apply a second voltage to the second word line in a write of data into the second cell transistor upon reception of the second instruction, the second voltage being different from the first voltage.

18. The system according to claim 17, wherein:
the memory device is configured to sequentially apply a third voltage higher than the first voltage to the first word line, apply the first voltage to the first word line, and apply a fourth voltage higher than the third voltage to the first word line upon reception of the first instruction.

19. The system of claim 17, wherein:
the first value is larger than the second value, and
the first word line is closer to a substrate than the second word line.

20. The system according to claim 17, wherein:
the first instruction instructs a write of the first data into the first cell transistor, and
the second instruction instructs a write of the first data into the second cell transistor.

* * * * *